| (12) | United States Patent | (10) Patent No.: US 11,424,259 B2 |
|---|---|---|
| | Jung et al. | (45) Date of Patent: *Aug. 23, 2022 |

(54) THREE-DIMENSIONAL SEMICONDUCTOR MEMORY DEVICES AND METHODS OF FABRICATING THE SAME

(71) Applicant: Samsung Electronics Co., Ltd., Suwon-si (KR)

(72) Inventors: Euntaek Jung, Seongnam-si (KR); Joongshik Shin, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/011,051

(22) Filed: Sep. 3, 2020

(65) Prior Publication Data

US 2020/0402991 A1 Dec. 24, 2020

Related U.S. Application Data

(63) Continuation of application No. 16/017,013, filed on Jun. 25, 2018, now Pat. No. 10,777,565.

(30) Foreign Application Priority Data

Nov. 20, 2017 (KR) .......................... 10-2017-0155163

(51) Int. Cl.
| H01L 27/11556 | (2017.01) |
| H01L 27/11582 | (2017.01) |
| H01L 27/11575 | (2017.01) |
| H01L 27/11565 | (2017.01) |
| H01L 27/1157 | (2017.01) |

(Continued)

(52) U.S. Cl.
CPC .... H01L 27/11556 (2013.01); H01L 27/1157 (2013.01); H01L 27/11519 (2013.01);
(Continued)

(58) Field of Classification Search
CPC ......... H01L 27/11556; H01L 27/11519; H01L 27/11524; H01L 27/11526;
(Continued)

(56) References Cited

U.S. PATENT DOCUMENTS

| 8,456,909 B2 | 6/2013 | Lee et al. |
| 8,541,831 B2 | 9/2013 | Chae et al. |

(Continued)

FOREIGN PATENT DOCUMENTS

| KR | 20110015337 | 2/2011 |
| KR | 20160094827 A | 8/2016 |

(Continued)

*Primary Examiner* — Patricia D Valenzuela
(74) *Attorney, Agent, or Firm* — Myers Bigel, P.A.

(57) ABSTRACT

Three-dimensional semiconductor memory devices and methods of fabricating the same are provided. A memory device may include a semiconductor layer including first and second regions, first vertical structures on the first region and extending in a first direction perpendicular to a top surface of the semiconductor layer, and second vertical structures on the second region and extending in the first direction. The first vertical structure may include a vertical semiconductor pattern extending in the first direction and in contact with the semiconductor layer, and a first data storage pattern surrounding the vertical semiconductor pattern. The second vertical structure may include an insulation structure extending in the first direction and in contact with the semiconductor layer, and a second data storage pattern surrounding the insulation structure.

20 Claims, 32 Drawing Sheets

(51) Int. Cl.
*H01L 27/11524* (2017.01)
*H01L 27/11573* (2017.01)
*H01L 27/11526* (2017.01)
*H01L 27/11519* (2017.01)
*H01L 27/11548* (2017.01)
*H01L 29/10* (2006.01)
*H01L 29/423* (2006.01)
*H01L 29/792* (2006.01)

(52) U.S. Cl.
CPC .. *H01L 27/11524* (2013.01); *H01L 27/11526* (2013.01); *H01L 27/11565* (2013.01); *H01L 27/11573* (2013.01); *H01L 27/11575* (2013.01); *H01L 27/11582* (2013.01); *H01L 27/11548* (2013.01); *H01L 29/1037* (2013.01); *H01L 29/4236* (2013.01); *H01L 29/792* (2013.01); *H01L 29/7926* (2013.01)

(58) Field of Classification Search
CPC ........... H01L 27/11565; H01L 27/1157; H01L 27/11573; H01L 27/11575; H01L 27/11582; H01L 27/11548; H01L 29/1037; H01L 29/4236; H01L 27/11529; H01L 29/7926; H01L 29/792
See application file for complete search history.

(56) References Cited

U.S. PATENT DOCUMENTS

| | | | |
|---|---|---|---|
| 8,809,938 | B2 | 8/2014 | Hwang et al. |
| 9,224,747 | B2 | 12/2015 | Mizutani et al. |
| 9,412,749 | B1 | 8/2016 | Shimabukuro et al. |
| 9,419,011 | B2 | 8/2016 | Lee et al. |
| 9,419,013 | B1 | 8/2016 | Lee et al. |
| 9,524,975 | B2 | 12/2016 | Eom |
| 9,576,967 | B1 | 2/2017 | Kimura et al. |
| 9,627,403 | B2 | 4/2017 | Liu et al. |
| 9,716,104 | B2 | 7/2017 | Kim et al. |
| 9,754,963 | B1 | 9/2017 | Kawamura et al. |
| 9,799,670 | B2 | 10/2017 | Nishikawa et al. |
| 9,806,089 | B2 | 10/2017 | Sharangpani et al. |
| 9,853,048 | B2 | 12/2017 | Kim et al. |
| 10,153,292 | B2 | 12/2018 | Kim et al. |
| 10,777,565 | B2 * | 9/2020 | Jung ................. H01L 27/11519 |
| 2011/0024816 | A1 * | 2/2011 | Moon ................. H01L 29/7926 257/329 |
| 2012/0003831 | A1 | 1/2012 | Kang et al. |
| 2014/0070302 | A1 | 3/2014 | Yoo et al. |
| 2015/0236038 | A1 | 8/2015 | Pachamuthu et al. |
| 2015/0340376 | A1 | 11/2015 | Park et al. |
| 2016/0056169 | A1 | 2/2016 | Lee et al. |
| 2016/0099155 | A1 | 4/2016 | Park et al. |
| 2016/0126253 | A1 | 5/2016 | Lee et al. |
| 2016/0225785 | A1 | 8/2016 | Kim et al. |
| 2016/0343727 | A1 | 11/2016 | Kim et al. |
| 2017/0098658 | A1 | 4/2017 | Matsuda et al. |

FOREIGN PATENT DOCUMENTS

| | | |
|---|---|---|
| KR | 20170018207 A | 2/2017 |
| WO | 2017034646 | 3/2017 |

* cited by examiner

THREE-DIMENSIONAL SEMICONDUCTOR MEMORY DEVICES AND METHODS OF FABRICATING THE SAME

CROSS-REFERENCE TO RELATED APPLICATIONS

The present application is a continuation of U.S. patent application Ser. No. 16/017,013, filed Jun. 25, 2018, which claims priority to and the benefit of Korean Patent Application No. 10-2017-0155163 filed on Nov. 20, 2017, the entire contents of which are hereby incorporated by reference.

TECHNICAL FIELD

The present disclosure relates to three-dimensional semiconductor memory devices and methods of fabricating the same, and more particularly, to three-dimensional semiconductor memory devices having enhanced reliability and integration and methods of fabricating the same.

BACKGROUND

Semiconductor devices have been increasingly integrated to satisfy high performance characteristics and low manufacture costs which are desired by customers. Since integration of the semiconductor devices is an important factor in determining product price, high integration is increasingly demanded in particular. Integration of typical two-dimensional or planar semiconductor memory devices is determined in part by the area occupied by a unit memory cell, such that it is greatly influenced by the level of technology for forming fine patterns. However, increasingly expensive processing equipment that is needed to increase pattern fineness may set a practical limitation on increasing the integration of the two-dimensional or planar semiconductor memory devices. Therefore, there have been proposed three-dimensional semiconductor memory devices having three-dimensionally arranged memory cells.

SUMMARY

Some aspects of the present disclosure provide a three-dimensional semiconductor memory device having enhanced reliability and integration.

Some aspects of the present disclosure provide a method of fabricating a three-dimensional semiconductor memory device by which the productivity of the three-dimensional semiconductor memory device may be enhanced.

The objectives of the present disclosure are not limited to those mentioned above, and other objectives which have not been mentioned above will be clearly understood to those skilled in the art from the following description.

According to aspects of the present disclosure, a three-dimensional semiconductor memory device may be provided. The three-dimensional semiconductor memory device may include a semiconductor layer including a first region and a second region; a plurality of first vertical structures on the first region and extending in a first direction perpendicular to a top surface of the semiconductor layer; and a plurality of second vertical structures on the second region and extending in the first direction. Each of the first vertical structures may comprise: a vertical semiconductor pattern extending in the first direction and contacting the semiconductor layer; and a first data storage pattern surrounding the vertical semiconductor pattern. Each of the second vertical structures may comprise: an insulation pillar extending in the first direction and contacting the semiconductor layer; and a second data storage pattern surrounding the insulation pillar.

According to aspects of the present disclosure, a three-dimensional semiconductor memory device may include a substrate having a first region and a second region; an electrode structure including electrodes vertically stacked on the substrate; a plurality of first vertical structures extending into the electrode structure on the first region; and a plurality of second vertical structures extending into the electrode structure on the second region. Each of the first vertical structures may comprise: a vertical semiconductor pattern extending into the electrode structure; and a first data storage pattern between the vertical semiconductor pattern and the electrode structure. Each of the second vertical structures may comprise: an insulation pillar penetrating the electrode structure; and a second data storage pattern between the insulation pillar and the electrode structure. A bottom surface of the insulation pillar may be lower than a bottom surface of the vertical semiconductor pattern and a bottom surface of the second data storage pattern.

According to aspects of the present disclosure, a method of fabricating a three-dimensional semiconductor memory device may include forming a mold structure on a substrate including a first region and a second region; patterning the mold structure to form first vertical holes extending into the mold structure on the first region and second vertical holes extending into the mold structure on the second region; forming first vertical structures in the first vertical holes and second vertical structures in the second vertical holes, each of the first and second vertical structures comprising a data storage pattern and a vertical semiconductor pattern; removing the vertical semiconductor patterns of the second vertical structures to expose the data storage patterns in the second vertical holes; and forming insulation pillars in the second vertical holes in which the data storage patterns are exposed.

DETAILED DESCRIPTION

Hereinafter, example embodiments of the inventive concepts provided by the present application will be described in detail in conjunction with the accompanying drawings.

Figure 1:
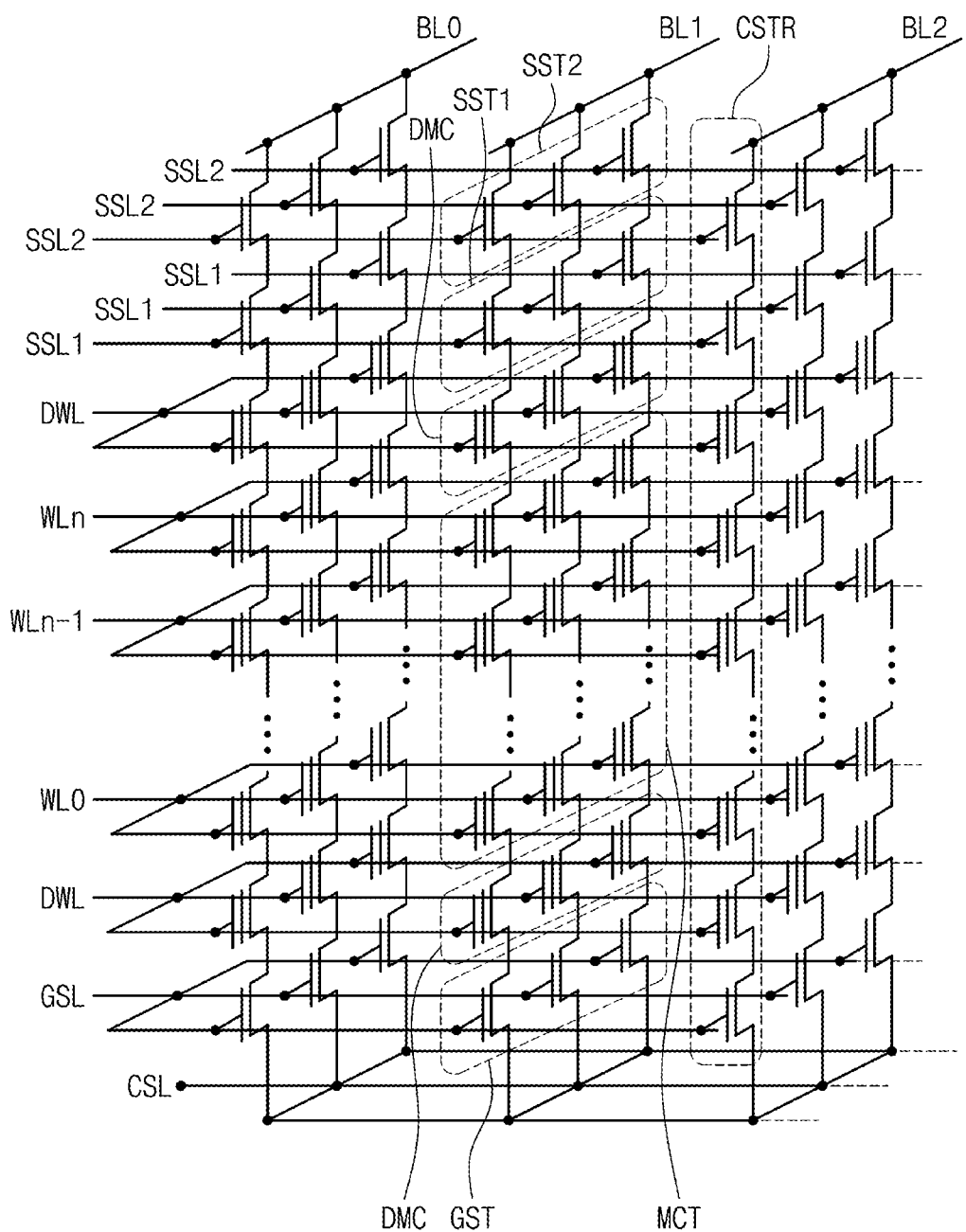
FIG. 1 illustrates a circuit diagram showing a cell array of a three-dimensional semiconductor memory device according to aspects of the present disclosure.

FIG. 1 illustrates a circuit diagram showing a cell array of a three-dimensional semiconductor memory device according to aspects of the present disclosure.

Referring to FIG. 1, a cell array of a three-dimensional semiconductor memory device according to some embodiments may include a common source line CSL, a plurality of bit lines BL0 to BL2, and a plurality of cell strings CSTR between the common source line CSL and the bit lines BL0 to BL2.

The bit lines BL0 to BL2 may be two-dimensionally arranged, and a plurality of cell strings CSTR may be connected in parallel to each of the bit lines BL0 to BL2. A plurality of cell strings CSTR may be commonly connected to the common source line CSL. For example, a plurality of cell strings CSTR may be disposed between a plurality of bit lines BL0 to BL2 and one common source line CSL. The common source line CSL may be provided in plural, and the plurality of common source lines CSL may be two-dimensionally arranged. The common source lines CSL may be supplied with the same voltage or electrically controlled independently of each other.

In some embodiments, each of the cell strings CSTR may include string select transistors SST1 and SST2 connected in series, memory cell transistors MCT connected in series, and a ground select transistor GST. Each of the memory cell transistors MCT may include a data storage element.

For example, each of the cell strings CSTR may include first and second string select transistors SST1 and SST2 connected in series. The second string select transistor SST2 may be coupled to one of the bit lines BL0 to BL2, and the ground select transistor GST may be coupled to the common source line CSL. The memory cell transistors MCT may be connected in series between the first string select transistor SST1 and the ground select transistor GST. Alternatively, each of the cell strings CSTR may include one string select transistor.

Each of the cell strings CSTR may further include a dummy cell transistor DMC connected between the first string select transistor SST1 and the memory cell transistor MCT. Although not shown in figures, other dummy cell transistor DMC may also be connected between the ground select transistor GST and the memory cell MCT.

The first string select transistor SST1 may be controlled by a first string select line SSL1, and the second string select transistor SST2 may be controlled by a second string select line SSL2. The memory cell transistors MCT may be controlled by a plurality of word lines WL0 to WLn, and the dummy cell transistors DMC may be controlled by a dummy word line DWL. The ground select transistor GST may be controlled by a ground select line GSL. The common source line CSL may be connected in common to sources of the ground select transistors GST.

Since one cell string CSTR may include a plurality of the memory cell transistors MCT at different distances from the common source line CSL, the word lines WL0 to WLn and DWL may be disposed between the common source line CSL and the bit lines BL0 to BL2.

The memory cell transistors MCT may include gate electrodes at substantially the same distance from the common source line CSL, and the gate electrodes may be connected in common to one of the word lines WL0 to WLn and DWL, thereby being in an equipotential state. Alternatively, although the gate electrodes of the memory cell transistors MCT are disposed at substantially the same distance from the common source line CSL, the gate electrodes disposed at different rows or columns may be controlled independently of each other.

Figure 2:
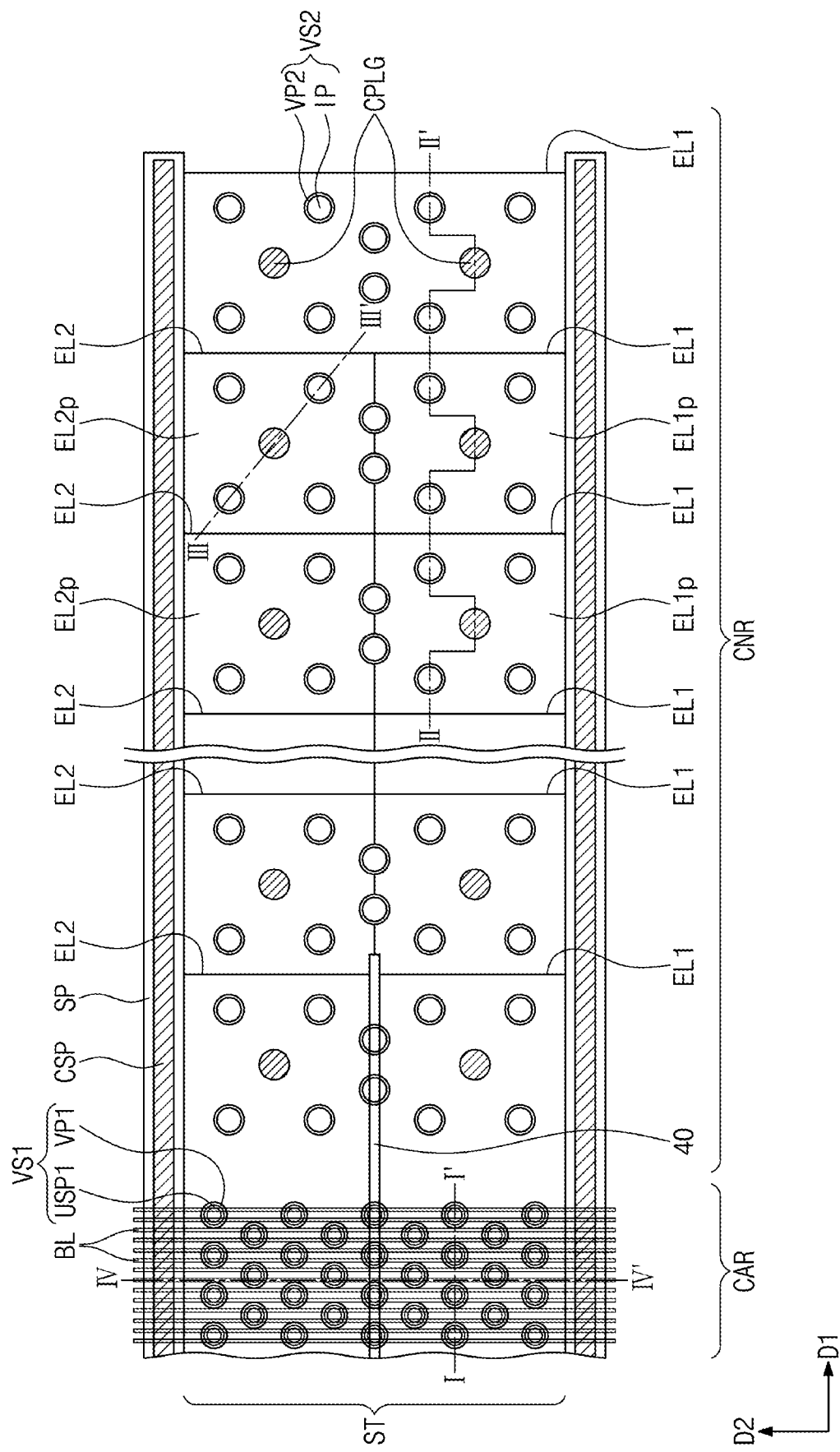
FIG. 2 illustrates a plan view showing a three-dimensional semiconductor memory device according to aspects of the present disclosure.
Figure 3:
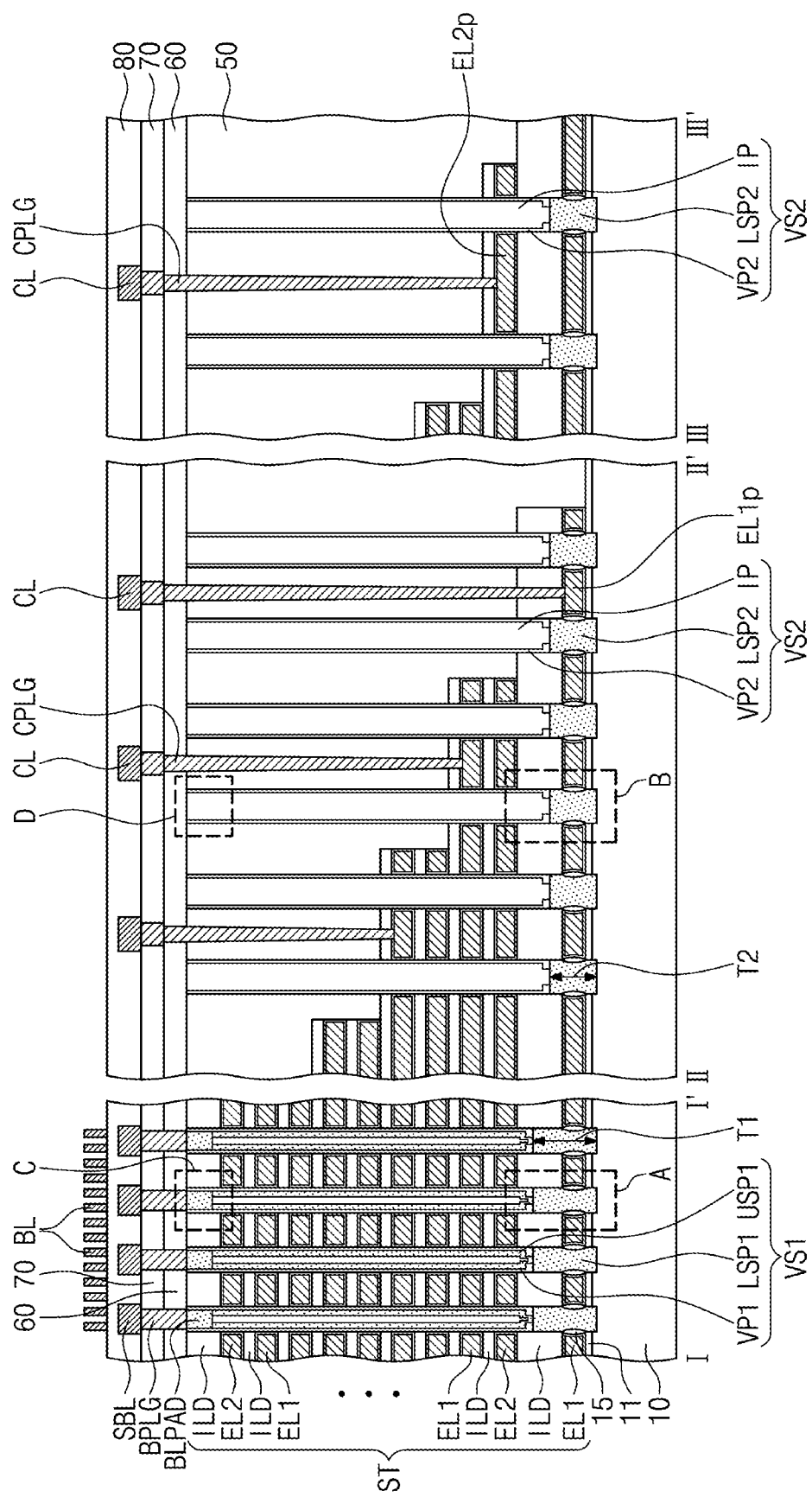
FIG. 3 illustrates a cross-sectional view taken along lines I-I', II-II', and III-III' of FIG. 2, showing a three-dimensional semiconductor memory device according to aspects of the present disclosure.
Figure 4:
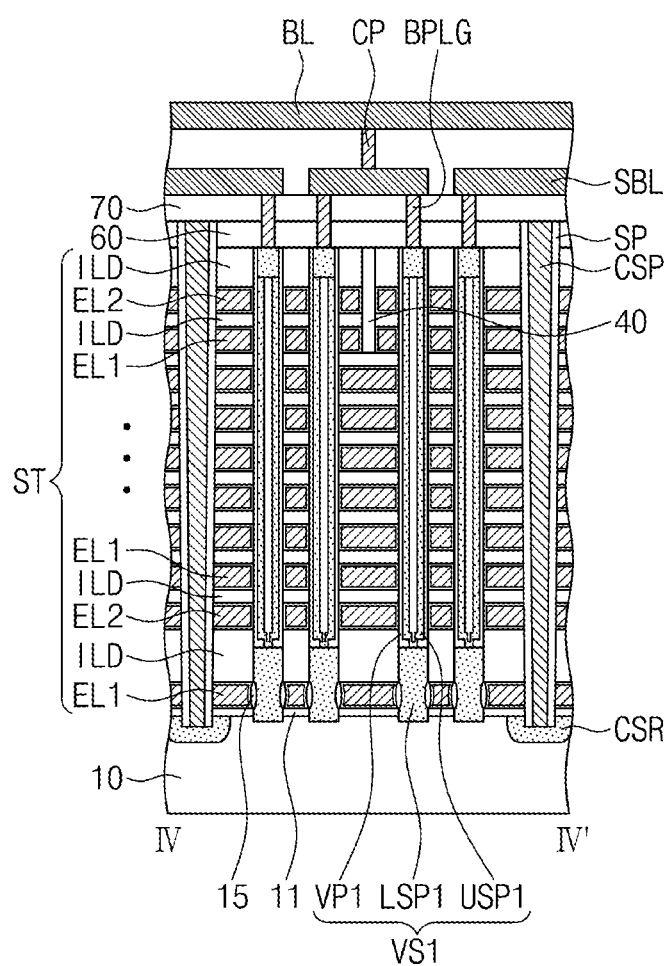
FIG. 4 illustrates a cross-sectional view taken along line IV-IV' of FIG. 2, showing a three-dimensional semiconductor memory device according to aspects of the present disclosure.
Figure 5A:
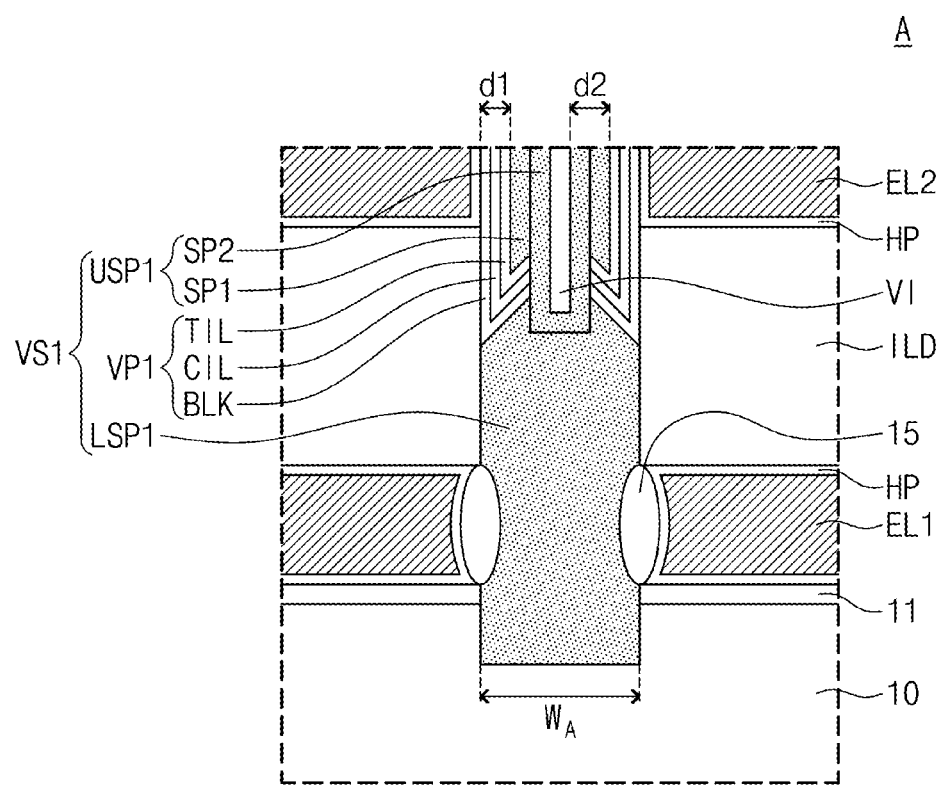
FIGS. 5A and 5B illustrate enlarged views respectively showing sections A and B of FIG. 3.
Figure 5B:
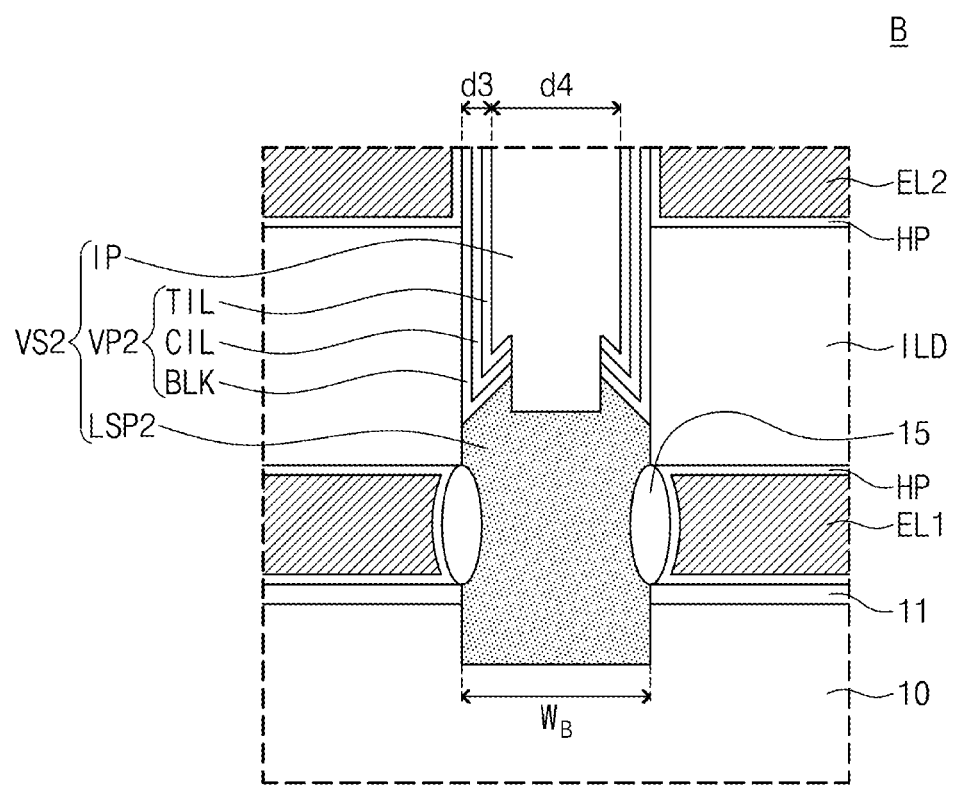
Figure 5C:
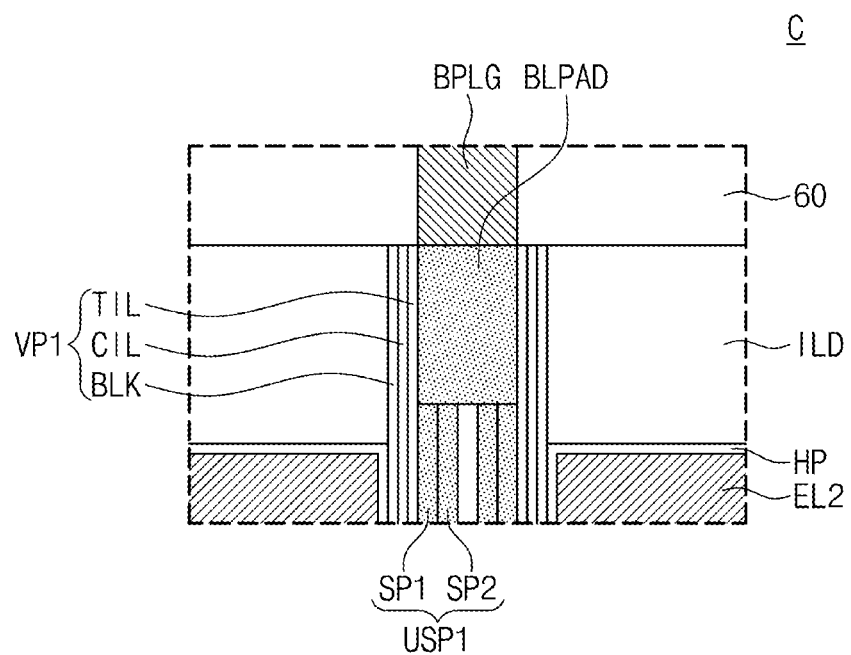
FIG. 5C illustrates an enlarged view showing section C of FIG. 3.
Figure 5D:
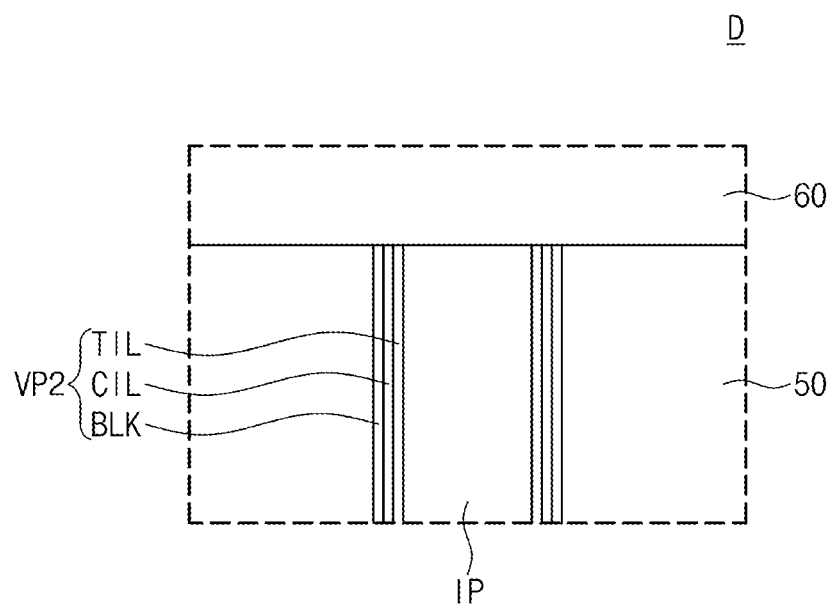
FIGS. 5D and 5E illustrate enlarged views showing section D of FIG. 2.
Figure 5E:
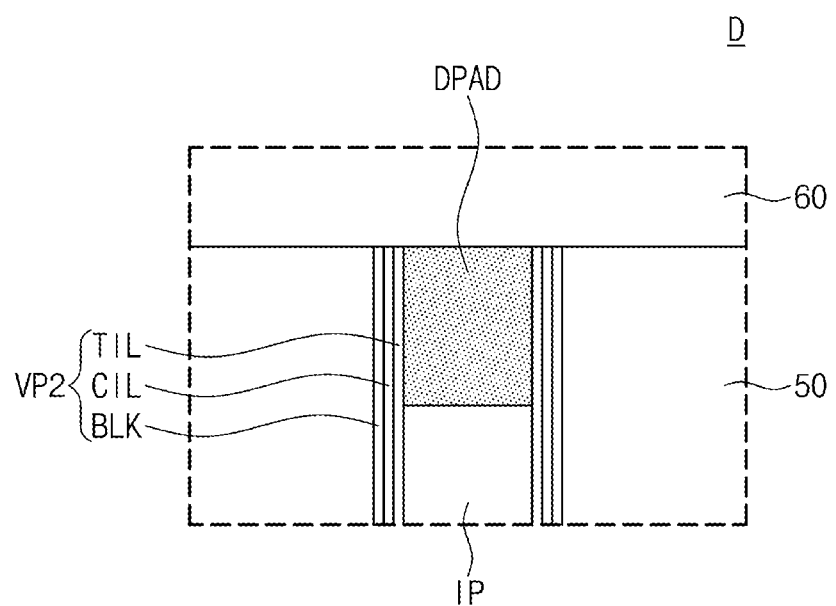

FIG. 2 illustrates a plan view showing a three-dimensional semiconductor memory device according to aspects of the present disclosure. FIG. 3 illustrates a cross-sectional view taken along lines I-I', II-II', and III-III' of FIG. 2, showing a three-dimensional semiconductor memory device according to aspects of the present disclosure. FIG. 4 illustrates a cross-sectional view taken along line IV-IV' of FIG. 2, showing a three-dimensional semiconductor memory device according to aspects of the present disclosure. FIGS. 5A and 5B illustrate enlarged views respectively showing sections A and B of FIG. 3. FIG. 5C illustrates an enlarged view showing section C of FIG. 3. FIGS. 5D and 5E illustrate enlarged views showing section D of FIG. 2.

Referring to FIGS. 2, 3, and 4, a substrate 10 may include a cell array region CAR and a connection region CNR. The substrate 10 may be or include one of a material having semiconductor characteristics (e.g., silicon wafer), an insulating material (e.g., glass), and a semiconductor or conductor covered with an insulating material. For example, the substrate 10 may be a silicon wafer having a first conductivity.

The substrate 10 may be provided thereon with an electrode structure ST extending from the cell array region CAR toward the connection region CNR along a first direction D1. The electrode structure ST may be provided in plural on the substrate 10, and the plurality of electrode structures ST may be spaced apart from each other along a second direction D2. A buffer insulation layer 11 may be interposed between the electrode structure ST and the substrate 10, and may include a silicon oxide layer.

The electrode structure ST may include electrodes EL1 and EL2 and insulation layers ILD that are alternately and repeatedly stacked along a third direction D3 perpendicular to a top surface of the substrate 10. The electrodes EL1 and EL2 may have substantially the same thickness, and the insulation layers ILD may have different thicknesses depending on characteristics of the three-dimensional semiconductor memory device. The thickness of each of the insulation layers ILD may be smaller than that of each of the electrodes EL1 and EL2. The electrodes EL1 and EL2 may include, for example, at least one material selected from doped semiconductor (e.g., doped silicon, etc.), metal (e.g., tungsten, copper, aluminum, etc.), conductive metal nitride (e.g., titanium nitride, tantalum nitride, etc.), and transition metal (e.g., titanium, tantalum, etc.). The insulation layers ILD may include, for example, a silicon oxide layer or a low-k dielectric layer.

The electrode structure ST may have a stepwise structure on the connection region CNR. For example, the electrodes EL1 and EL2 may have lengths in the first direction D1 that decrease with increasing distance from the substrate 10, and the electrode structure ST may have a height that decreases with increasing distance from the cell array region CAR. The electrodes EL1 and EL2 may have sidewalls that are equally spaced apart from each other along the first direction D1.

The electrodes EL1 and EL2 may have pads EL1p and EL2p located at different horizontal and vertical positions.

The electrode structure ST may include first electrodes EL1 and second electrodes EL2 that are alternately stacked along the third direction D3. The pads EL1p of the first electrodes EL1 may constitute a first stepwise structure along the first direction D1, and the pads EL2p of the second electrodes EL2 may constitute a second stepwise structure along the first direction D1. The first stepwise structure and the second stepwise structure may be adjacent to each other in the second direction D2 intersecting the first direction D1. For example, a length in the first direction D1 of one first electrode EL1 may be greater than that in the first direction D1 of a next first electrode EL1 directly above the one first electrode EL1. Likewise, the length in the first direction D1 of one second electrode EL2 may be greater than that in the first direction D1 of a next second electrode EL2 directly above the one second electrode EL2.

Uppermost first electrodes EL1 may have linear shapes extending in the first direction D1, and may be spaced apart from each other across a separation insulation pattern 40. Likewise, uppermost second electrodes EL2 may have linear shapes extending in the first direction D1, and may be spaced apart from each other across the separation insulation pattern 40.

In some embodiments, the three-dimensional semiconductor memory device may be a vertical NAND Flash memory device, and in such cases the electrodes EL1 and EL2 of the electrode structure ST may serve as control gate electrodes of memory cell transistors (e.g., MCT of FIG. 1). For example, the electrodes EL1 and EL2 may be used as the ground select line GSL, the word lines WL0 to WLn and DWL, and the string select lines SSL1 and SSL2 discussed above with reference to FIG. 1.

A planarized insulation layer 50 may cover the substrate 10 on which the electrode structure ST is disposed. The planarized insulation layer 50 may have a substantially planarized top surface, and may cover the stepwise structure of the electrode structure ST on the connection region CNR. The planarized insulation layer 50 may include one insulation layer or a plurality of stacked insulation layers, such as a silicon oxide layer and/or a low-k dielectric layer.

The cell array region CAR may be provided with a plurality of first vertical structures VS1 penetrating the electrode structure ST, and the connection region CNR may be provided with a plurality of second vertical structures VS2 penetrating the planarized insulation layer 50 and the electrode structure ST.

When viewed in plan, the first vertical structures VS1 may be arranged in a zigzag fashion along the first direction D1. The first vertical structures VS1 may include a semiconductor material such as silicon (Si), germanium (Ge), or a mixture thereof. Additionally or alternatively, the first vertical structures VS1 may include an impurity-doped semiconductor or an undoped intrinsic semiconductor. The first vertical structures VS1 including the semiconductor material may serve as channels of the select transistors SST and GST and the memory cell transistors MCT discussed above with reference to FIG. 1.

The second vertical structures VS2 may penetrate the stepwise structure of the electrode structure ST, and the number of the electrodes EL1 and EL2 penetrated by the second vertical structures VS2 may decrease as the second vertical structures VS2 become distant from the cell array region CAR. The second vertical structures VS2 may be arranged along the first and second directions D1 and D2 when viewed in plan, and may penetrate the pads EL1p and EL2p of the electrodes EL1 and EL2 on the connection region CNR. A plurality of the second vertical structures VS2 may penetrate each of the pads EL1p and EL2p of the electrodes EL1 and EL2. For example, four second vertical structures VS2 may penetrate each of the pads EL1p and EL2p of the electrodes EL1 and EL2, but the present disclosure is not limited thereto. For another example, each of the pads EL1p and EL2p of the electrodes EL1 and EL2 may be penetrated by one, two, three, or more than three (e.g., five) second vertical structures VS2. In addition, when viewed in plan, one or more of the second vertical structures VS2 may be placed on a boundary between the pads EL1p and EL2p of the electrodes EL1 and EL2.

Each of the first vertical structures VS1 may have a first width, and each of the second vertical structures VS2 may have a second width greater than the first width. The first and second vertical structures VS1 and VS2 may have bottom surfaces at substantially the same level. The first and second vertical structures VS1 and VS2 may have substantially the same length in the third direction D3.

In some embodiments, each of the first vertical structures VS1 may include a first lower semiconductor pattern LSP1, a first upper semiconductor pattern USP1, and a first data storage pattern VP1. Each of the second vertical structures VS2 may include a second lower semiconductor pattern LSP2, a second data storage pattern VP2, and an insulation pillar IP.

Referring to FIG. 5A, the first lower semiconductor pattern LSP1 may be in direct contact with the substrate 10, and may include a pillar-shaped epitaxial layer grown from the substrate 10. The first lower semiconductor pattern LSP1 may include silicon (Si), germanium (Ge), silicon-germanium (Ge), a III-V group semiconductor compound, or a II-VI group semiconductor compound. The first lower semiconductor pattern LSP1 may be an impurity-undoped pattern or an impurity-doped pattern having the same conductivity as that of the substrate 10.

The first lower semiconductor pattern LSP1 may have a first height T1 in the third direction D3 and a first lower width $W_A$. The first height T1 of the first lower semiconductor pattern LSP1 may be greater than the thickness of a lowermost first electrode ELL The first lower semiconductor pattern LSP1 may have a top surface higher than that of the lowermost first electrode EL1 and lower than that of an uppermost insulation layer ILD. A gate dielectric layer 15 may be disposed on a portion of a sidewall of the first lower semiconductor pattern LSP1. The gate dielectric layer 15 may be disposed between the lowermost first electrode EL1 and the first lower semiconductor pattern LSP1. The gate dielectric layer 15 may include a silicon oxide layer (e.g., a thermal oxide layer). The gate dielectric layer 15 may have a rounded sidewall.

The first upper semiconductor pattern USP1 may be in direct contact with the first lower semiconductor pattern LSP1, and may have a U shape or a pipe shape with a closed bottom end. The first upper semiconductor pattern USP1 may have an inside filled with a first buried insulation pattern VI including an insulating material. The first upper semiconductor pattern USP1 may be surrounded by the first data storage pattern VP1, and may have a thickness d2 less than half a width of the insulation pillar IP provided on the connection region CNR. The first upper semiconductor pattern USP1 may have a bottom surface lower than the top surface of the first lower semiconductor pattern LSP1. The first upper semiconductor pattern USP1 may include a semiconductor material undoped or doped with impurities having the same conductivity as that of the substrate 10. The first upper semiconductor pattern USP1 may have a different crystal structure from that of the first lower semiconductor pattern LSP1. For example, the first upper semiconductor pattern USP1 may have at least one selected from a single crystalline structure, an amorphous structure, and a polycrystalline structure.

The first upper semiconductor pattern USP1 may include a first semiconductor pattern SP1 and a second semiconductor pattern SP2. The first semiconductor pattern SP1 may have a macaroni or pipe shape with opened top and bottom ends. The first semiconductor pattern SP1 may be in direct contact with an inner sidewall of the first data storage pattern VP1. The first semiconductor pattern SP1 may not be in contact with but be spaced apart from the first lower semiconductor pattern LSP1.

The second semiconductor pattern SP2 may be coupled to the first lower semiconductor pattern LSP1, and may have a macaroni or pipe shape with a closed bottom end. The second semiconductor pattern SP2 may have an inside filled with the first buried insulation pattern VI. The second semiconductor pattern SP2 may be in contact with an inner wall of the first semiconductor pattern SP1 and the top surface of the first lower semiconductor pattern LSP1. In this configuration, the second semiconductor pattern SP2 may electrically connect the first semiconductor pattern SP1 and the first lower semiconductor pattern LSP1.

The first data storage pattern VP1 may be disposed between the electrode structure ST and the first upper semiconductor pattern USP1. The first date storage pattern VP1 may extend in the third direction D3 and surround a sidewall of the first upper semiconductor pattern USP1. For example, the first data storage pattern VP1 may have a macaroni or pipe shape with opened top and bottom ends.

The first data storage pattern VP1 may have a first thickness d1 on the sidewall of the first upper semiconductor pattern USP1. The first data storage pattern VP1 may be in partial contact with the top surface of the first lower semiconductor pattern LSP1. The first data storage pattern VP1 may have a bottom surface higher than the bottom surface of the first upper semiconductor pattern USP1.

The first data storage pattern VP1 may include a single thin layer or a plurality of thin layers. In some embodiments, the first data storage pattern VP1 may include a tunnel insulation layer TIL, a charge storage layer CIL, and a blocking insulation layer BLK, which constitute a data storage layer of a NAND Flash memory device. The charge storage layer CIL may be or include a trap insulation layer, a floating gate electrode, or an insulation layer including conductive nanodots. For example, the charge storage layer CIL may include one or more of a silicon nitride layer, a silicon oxynitride layer, a silicon-rich nitride layer, a nanocrystalline silicon layer, and a laminated trap layer. The tunnel insulation layer TIL may be or include one of materials having a band gap greater than that of the charge storage layer CIL, and the blocking insulation layer BLK may be or include a high-k dielectric layer such as an aluminum oxide layer or a hafnium oxide layer. Alternatively, the first data storage pattern VP1 may include a thin layer for a phase change memory device or a variable resistance memory device.

Referring to FIG. 5B, the second lower semiconductor pattern LSP2 may be in direct contact with the substrate 10, and may include a columnar or pillar-shaped epitaxial layer grown from the substrate 10. The second lower semiconductor pattern LSP2 may include the same semiconductor material as that of the first lower semiconductor pattern LSP1 provided on the cell array region CAR.

The second lower semiconductor pattern LSP2 may have a second height T2 in the third direction D3 less than the first height T1 of the first lower semiconductor pattern LSP1. The second lower semiconductor pattern LSP2 may have a top surface higher than that of the lowermost first electrode ELL In some embodiments, the second height T2 of the second lower semiconductor pattern LSP2 may be substantially the same as the first height T1 of the first lower semiconductor pattern LSP1. The second lower semiconductor pattern LSP2 may have a second lower width $W_B$ greater than the first lower width $W_A$ of the first lower semiconductor pattern LSP1.

The insulation pillar IP may penetrate the planarized insulation layer 50 and a portion of the electrode structure ST to be in direct contact with the second lower semiconductor pattern LSP2. The insulation pillar IP may have a width d4 less than the second lower width $W_B$ of the second lower semiconductor pattern LSP2. The insulation pillar IP may have a bottom surface lower than the top surface of the first lower semiconductor pattern LSP1. The bottom surface of the insulation pillar IP may be lower than that of the second data storage pattern VP2 and that of the first buried insulation pattern VI that fills the inside of the first upper semiconductor pattern USP1. The bottom surface of the insulation pillar IP may also be lower than that of the first upper semiconductor pattern USP1.

The insulation pillar IP may include an insulating material, for example, PE-TEOS (plasma enhanced tetraethylorthosilicate), $O_3$-TEOS ($O_3$-tetraethylorthosilicate), USG (undoped silicate glass), PSG (phosphosilicate glass), BSG (borosilicate glass), BPSG (borophosphosilicate glass), FSG (fluorosilicate glass), SOG (spin on glass), TOSZ (tonen silazene), or a combination thereof.

The second data storage pattern VP2 may surround a sidewall of the insulation pillar IP. Likewise the first data storage pattern VP1, the second data storage pattern VP2 may have a macaroni or pipe shape with opened top and bottom ends. The second data storage pattern VP2 may be in partial contact with the top surface of the second lower semiconductor pattern LSP2. The second data storage pattern VP2 may have the same thin-film structure as that of the first data storage pattern VP1. In some embodiments, the second data storage pattern VP2 may include a tunnel insulation layer TIL, a charge storage layer CIL, and a blocking insulation layer BLK, which constitute a data storage layer of a NAND Flash memory device.

The second data storage pattern VP2 may have a second thickness d3 on the sidewall of the insulation pillar IP, and the second thickness d3 may be substantially the same as or less than the first thickness d1 of the first data storage pattern VP1.

Referring to FIGS. 5A and 5B, a horizontal insulation pattern HP may extend onto top and bottom surfaces of the electrodes EL1 and EL2 from between the electrodes EL1 and EL2 and the first and second vertical structures VS1 and VS2. The horizontal insulation pattern HP may include a charge storage layer and a tunnel insulation layer as components of a data storage layer of an NAND Flash memory device. Alternatively, the horizontal insulation pattern HP may include a blocking insulation layer.

Referring back to FIGS. 2, 3, and 4, the first upper semiconductor pattern USP1 may be provided on its top end with a bit line pad BLPAD coupled to a bit line contact plug BPLG. The bit line pad BLPAD may include an impurity-doped semiconductor material.

Referring to FIG. 5C, the bit line pad BLPAD may have a bottom surface higher than the top surface of the uppermost second electrode EL2 and lower than a top surface of the first data storage pattern VP1. For example, the bit line pad BLPAD may be surrounded by the first data storage pattern VP1. Alternatively, the bit line pad BLPAD may be placed on a top surface of the first upper semiconductor pattern USP1 and the top surface of the first data storage pattern VP1. The bit line pad BLPAD may have a top surface substantially coplanar with those of the insulation pillars IP included in the second vertical structures VS2.

Referring to FIG. 5D, a first interlayer dielectric layer 60 may cover the top surfaces of the insulation pillars IP included in the second vertical structures VS2.

In some embodiments, as illustrated in FIG. 5E, when the second vertical structure VS2 is provided on its top end with a dummy bit line pad DPAD, the top surface of the bit line pad BLPAD may be substantially coplanar with a top surface of the dummy bit line pad DPAD. The dummy bit line pad DPAD may include the same material as that of the bit line pad BLPAD.

Referring again to FIGS. 2, 3, and 4, common source regions CSR may extend parallel to the electrode structures ST along the first direction D1. The common source regions CSR may be formed by implanting the substrate 10 with impurities having a second conductivity. The common source regions CSR may include, for example, n-type impurities (e.g., arsenic (As) or phosphorous (P)).

The electrode structures ST may be provided therebetween with a common source plug CSP coupled to the common source region CSR. For example, the common source plug CSP may have a substantially uniform upper width and extend parallel to the first direction D1. An insulation spacer SP may be interposed between the common source plug CSP and each of opposite sidewalls of the electrode structure ST. Alternatively, the common source plug CSP may penetrate the insulation spacer SP to be in partial contact with the common source region CSR.

The first interlayer dielectric layer 60 may be disposed on the planarized insulation layer 50, and may cover top surfaces of the first vertical structures VS1 and top surfaces of the second vertical structures VS2. For example, the first interlayer dielectric layer 60 may cover the top surfaces of the bit line pads BLPAD and the top surfaces of the insulation pillars IP. The first interlayer dielectric layer 60 may be provided thereon with a second interlayer dielectric layer 70 covering top surfaces of the common source plugs CSP.

Cell contact plugs CPLG may penetrate the planarized insulation layer 50 and the first and second interlayer dielectric layers 60 and 70 to be connected to the pads EL1p and EL2p of the electrodes EL1 and EL2. The cell contact plugs CPLG may have vertical lengths that decrease with decreasing distance from the cell array region CAR. The cell contact plugs CPLG may have top surfaces substantially coplanar with each other.

When viewed in plan, each of the cell contact plugs CPLG may be surrounded by the second vertical structures VS2. For example, each of the cell contact plugs CPLG may be positioned between the second vertical structures VS2 adjacent to each other.

Subsidiary bit lines SBL may be disposed on the second interlayer dielectric layer 70 of the cell array region CAR, and electrically connected through the bit line contact plugs BPLG to the first vertical structures VS1 adjacent to each other. Connection lines CL may be disposed on the second interlayer dielectric layer 70 of the connection region CNR, and coupled to the cell contact plugs CPLG. The second interlayer dielectric layer 70 may be provided thereon with a third interlayer dielectric layer 80 covering the subsidiary bit lines SBL and the connection lines CL.

Bit lines BL may be disposed on the third interlayer dielectric layer 80, and may extend in the second direction D2 to cross over the electrode structure ST. The bit lines BL may be coupled through contact plugs CP to the subsidiary bit lines SBL.

In some embodiments, since an upper portion of the second vertical structure VS2 is made of an insulating material without a semiconductor material, when a three-dimensional semiconductor memory device is operated, no current may flow through the second vertical structures VS2 even when the cell contact plugs CPLG are adjacent to or in contact with the second vertical structures VS2. In addition, even though a distance is reduced between the cell contact plug CPLG and its adjacent second vertical structure VS2, a process margin of the cell contact plugs CPLG may be securely obtained regardless of the positions of the second vertical structures VS2.

Hereinafter, various aspects of the present disclosure will be described with reference to FIGS. 6 to 16. A description of technical features the same as those of the three-dimensional semiconductor memory devices discussed with reference to FIGS. 2, 3, 4, and 5A to 5E is omitted in the interest of brevity of explanation.

Figure 6:
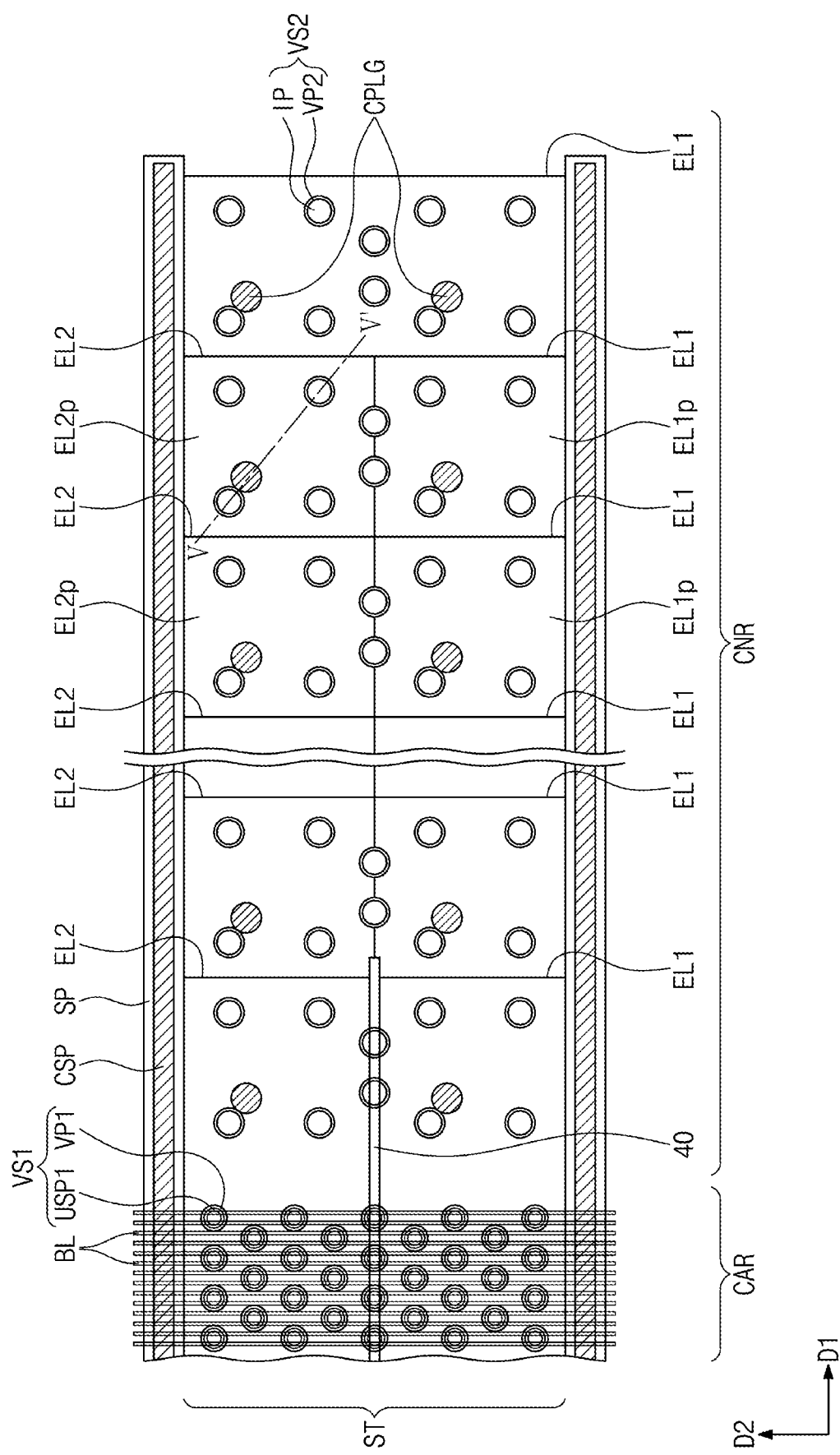
FIG. 6 illustrates a plan view showing a three-dimensional semiconductor memory device according to aspects of the present disclosure.
Figure 7:
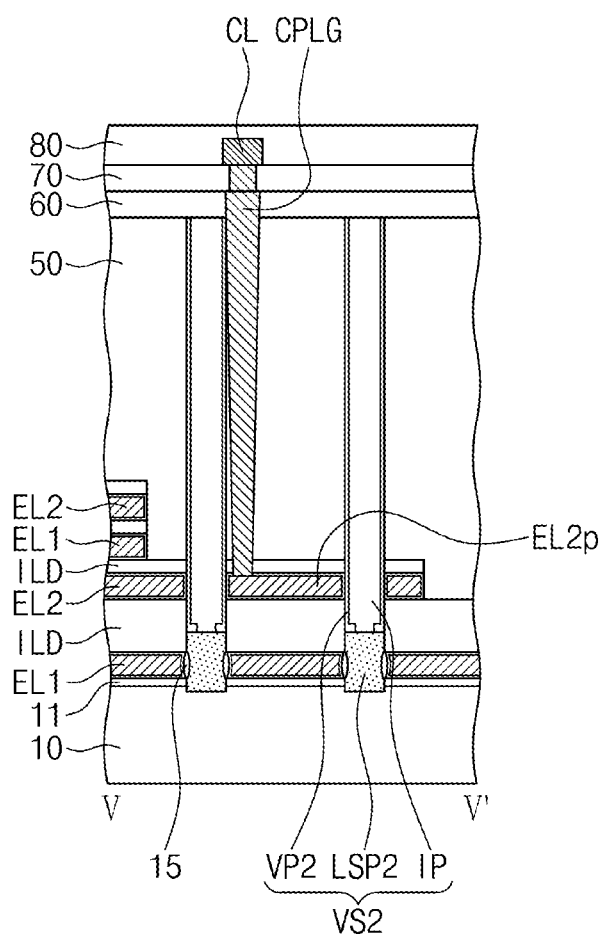
FIG. 7 illustrates a cross-sectional view taken along line V-V' of FIG. 6, showing a three-dimensional semiconductor memory device according to aspects of the present disclosure.

FIG. 6 illustrates a plan view showing a three-dimensional semiconductor memory device according to aspects of the present disclosure. FIG. 7 illustrates a cross-sectional view taken along line V-V' of FIG. 6, showing a three-dimensional semiconductor memory device according to aspects of the present disclosure.

Referring to FIGS. 6 and 7, the second vertical structures VS2 penetrating each of the pads EL1p and EL2p of the electrodes EL1 and EL2 may be positioned at different distances from the cell contact plug CPLG. For example, the cell contact plug CPLG may be positioned away from the center of each of the pads EL1p and EL2p of the electrodes EL1 and EL2.

For example, the cell contact plug CPLG may be in contact with one of the second vertical structures VS2. Since the upper portion of the second vertical structure VS2 is made of an insulating material, it may be possible to obtain good operating characteristics of a three-dimensional semiconductor memory device even when the cell contact plug CPLG is in contact with the second vertical structure VS2.

Figure 8:
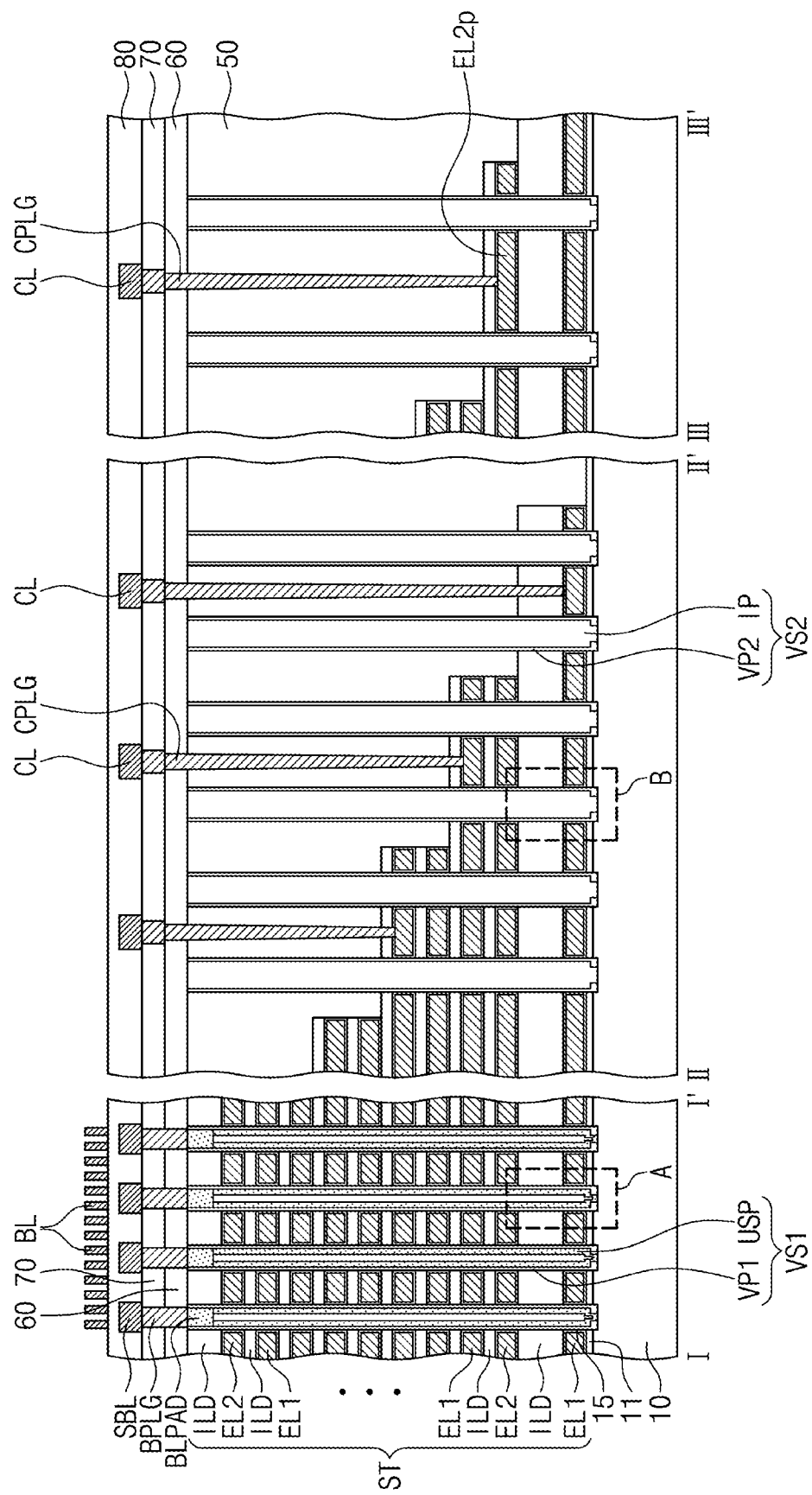
FIG. 8 illustrates a cross-sectional view taken along lines I-I', II-II', and III-III' of FIG. 2, showing a three-dimensional semiconductor memory device according to aspects of the present disclosure.
Figure 9A:
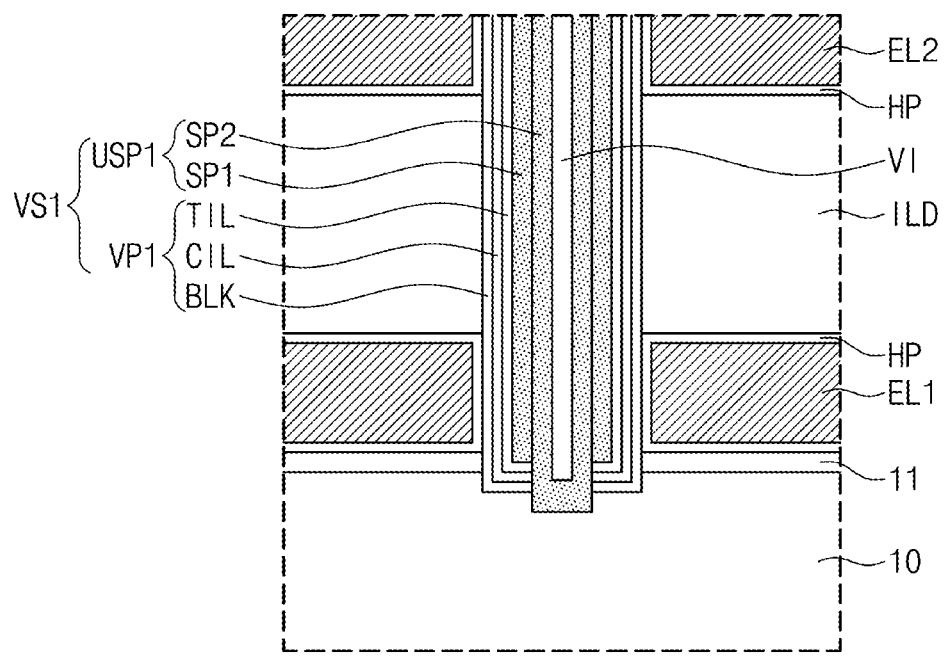
FIGS. 9A and 9B illustrate enlarged views respectively showing sections A and B of FIG. 8.
Figure 9B:
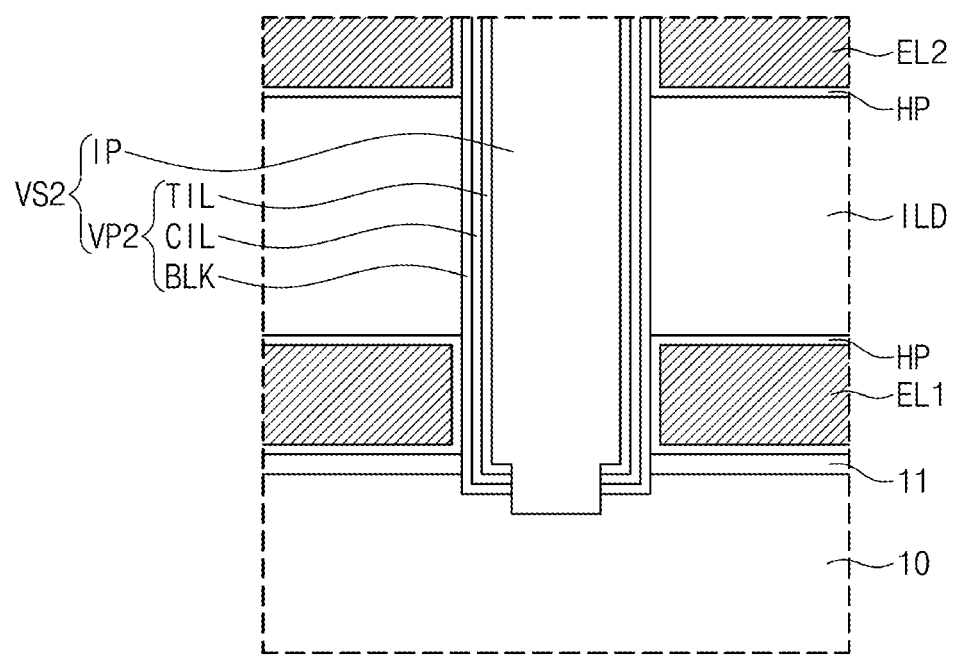

FIG. 8 illustrates a cross-sectional view taken along lines I-I', II-II', and III-III' of FIG. 2, showing a three-dimensional semiconductor memory device according to aspects of the present disclosure. FIGS. 9A and 9B illustrate enlarged views respectively showing sections A and B of FIG. 8.

In an embodiment illustrated in FIG. 8, the first and second vertical structures VS1 and VS2 may not include first and second lower semiconductor patterns LSP1 and LSP2 discussed above with reference to FIGS. 3 and 4.

Referring to FIGS. 2, 8, and 9A, on the cell array region CAR, each of the first vertical structures VS1 may include a vertical semiconductor pattern USP and a first data storage pattern VP1 surrounding the vertical semiconductor pattern USP. The vertical semiconductor patterns USP and the first data storage patterns VP1 may be in direct contact with the substrate 10. Likewise the first upper semiconductor pattern USP1 discussed above, each of the vertical semiconductor patterns USP included in the first vertical structures VS1 may include a first semiconductor pattern SP1 and a second semiconductor pattern SP2. The second semiconductor pattern SP2 may be in direct contact with the substrate 10, and may have an inside filled with a buried insulation pattern VI.

Referring to FIGS. 2, 8, and 9B, each of the second vertical structures VS2 may include a second data storage pattern VP2 and an insulation pillar IP. In the connection region CNR, the data storage pattern VP2 and the insulation pillar IP may penetrate the planarized insulation layer 50 and the electrode structure ST to come into direct contact with the substrate 10.

Figure 10:
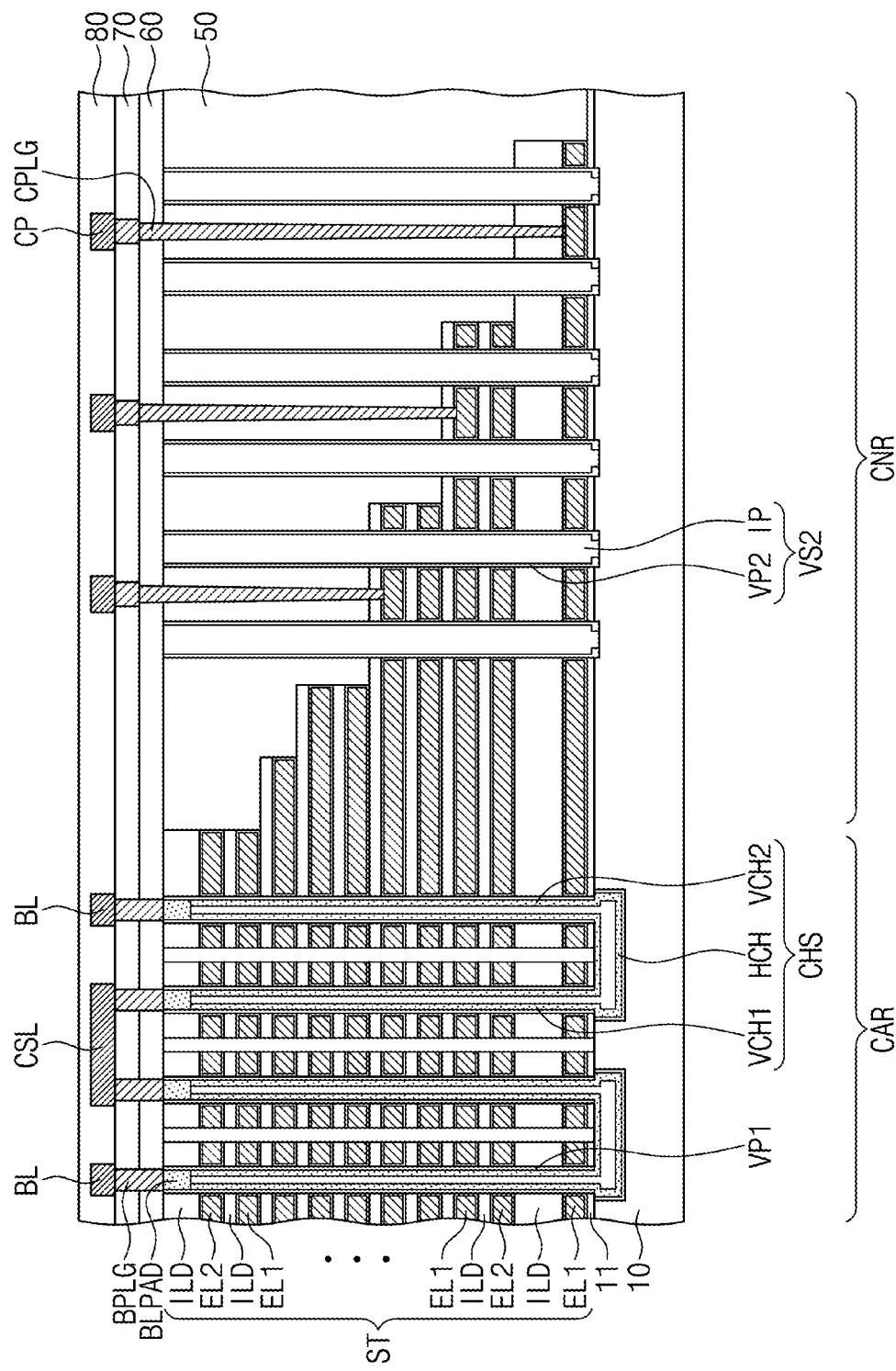
FIGS. 10 and 11 illustrate cross-sectional views showing a three-dimensional semiconductor memory device according to aspects of the present disclosure.
Figure 11:
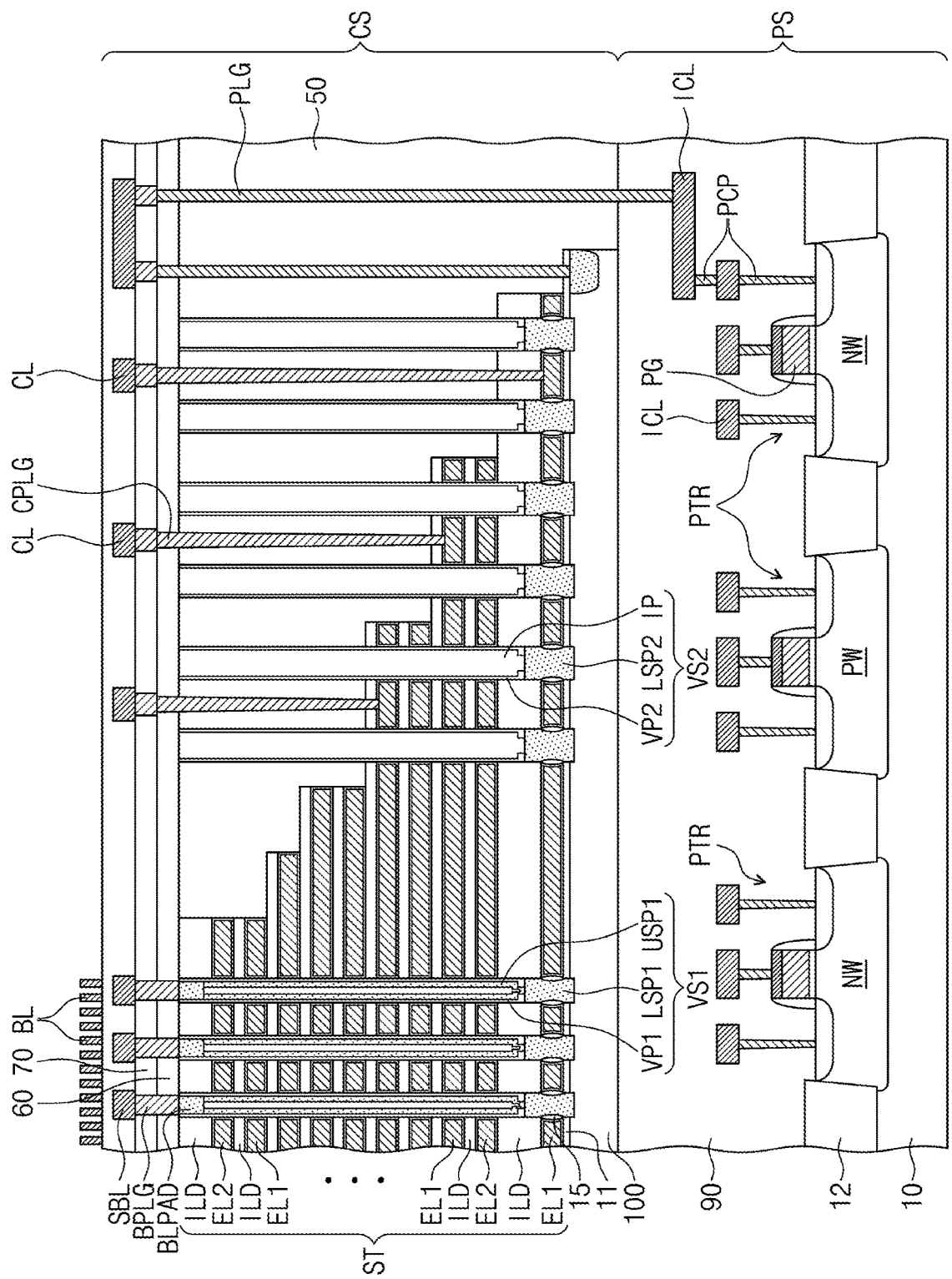

FIGS. 10 and 11 illustrate cross-sectional views showing a three-dimensional semiconductor memory device according to aspects of the present disclosure.

In an embodiment illustrated in FIG. 10, channel structures CHS may be provided on the substrate 10 of the cell array region CAR. Each of the channel structures CHS may include a first vertical channel VCH1 penetrating the electrode structure ST, a second vertical channel VCH2 penetrating the electrode structure ST, and a horizontal channel HCH connecting the first and second vertical channels VCH1 and VCH2 to each other below the electrode structure ST. The first and second vertical channels VCH1 and VCH2 may be provided in vertical holes that penetrate the electrode structure ST. The horizontal channel HCH may be provided in a recessed region formed in the substrate 10. The horizontal channel HCH may be provided between the substrate 10 and the electrode structure ST, connecting the first and second vertical channels VCH1 and VCH2 to each other. In some embodiments, the horizontal channel HCH may have a macaroni or hollow pipe shape that is successively connected to the first and second vertical channels VCH1 and VCH2. For example, the horizontal channel HCH and the first and second vertical channels VCH1 and VCH2 may be connected to have a unitary pipe shape. In such a configuration, the horizontal channel HCH and the first and second vertical channels VCH1 and VCH2 may be made of a single semiconductor layer continuously extending without interruption. As discussed above, the first data storage pattern VP1 may be interposed between the electrodes EL1 and EL2 and the first and second vertical channels VCH1 and VCH2 and between the horizontal channel HCH and the substrate 10.

In some embodiments, each of the channel structures CHS may be configured in such a way that the first vertical channel VCH1 is connected to the bit line BL and the second vertical channel VCH2 is connected to the common source line CSL.

In an embodiment illustrated in FIG. 11, a three-dimensional semiconductor memory device may include a peripheral logic structure PS and a cell array structure CS, which is stacked on the peripheral logic structure PS. For example, when viewed in plan, the peripheral logic structure PS and the cell array structure CS may overlap each other.

The peripheral logic structure PS and the cell array structure CS may be sequentially stacked on a substrate 10. For example, when viewed in vertical, the peripheral logic structure PS may be disposed between the substrate 10 and the cell array structure CS. In this configuration, when viewed in plan, the peripheral logic structure PS and the cell array structure CS may overlap each other.

The substrate 10 may be or include a silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG). The substrate 10 may include an n-well region NW doped with n-type impurities and a p-well region PW doped with p-type impurities. A device isolation layer 12 may define active regions in the n-well region NW and the p-well region PW.

The peripheral logic structure PS may include high-voltage and low-voltage transistors, a resistor, and a capacitor. For example, the peripheral logic structure PS may include peripheral gate electrodes PG, source and drain impurity regions on opposite sides of each of the peripheral gate electrodes PG, peripheral circuit plugs PCP, peripheral circuit lines ICL, and a lower buried insulation layer 90 covering peripheral circuits. PMOS transistors may be formed on the n-well region NW and NMOS transistors may be formed on the p-well region PW. The peripheral circuit lines ICL may be electrically connected through the peripheral circuit plugs PCP to the peripheral circuits. For example, the peripheral circuit plugs PCP and the peripheral circuit lines ICL may be coupled to the NMOS and PMOS transistors.

The lower buried insulation layer 90 may cover the peripheral circuits, the peripheral circuit plugs PCP, and the peripheral circuit lines ICL. The lower buried insulation layer 90 may include a plurality of stacked insulation layers.

The cell array structure CS may be disposed on the lower buried insulation layer 90, and may include a horizontal semiconductor layer 100, electrode structures ST, and first and second vertical structures VS1 and VS2.

The horizontal semiconductor layer 100 may be formed on a top surface of the lower buried insulation layer 90 covering the peripheral circuits. For example, the horizontal semiconductor layer 100 may be in contact with the lower buried insulation layer 90. The horizontal semiconductor layer 100 may include a cell array region CAR and a connection region CNR adjacent to the cell array region CAR, as discussed with reference to FIGS. 2, 3, and 4.

The horizontal semiconductor layer 100 may include a semiconductor material including, for example, silicon (Si), germanium (Ge), silicon-germanium (SiGe), gallium-arsenic (GaAs), indium-gallium-arsenic (InGaAs), aluminum-gallium-arsenic (AlGaAs), or a mixture thereof. Additionally or alternatively, the horizontal semiconductor layer 100 may include a semiconductor doped with first conductivity impurities or an intrinsic semiconductor with no doped impurities. Additionally or alternatively, the horizontal semiconductor layer 100 may have a crystal structure including at least one selected from a single crystalline structure, an amorphous structure, and a polycrystalline structure.

A buffer insulation layer 11 may be formed on a top surface of the horizontal semiconductor layer 100. The electrode structures ST may be disposed on the buffer insulation layer 11. On the horizontal semiconductor layer 100, as discussed with reference to FIGS. 2, 3, and 4, the electrode structures ST may extend parallel to each other in a first direction D1 and may be arranged spaced apart from each other in a second direction D2. Each of the electrode structures ST may include electrodes EL1 and EL2 vertically stacked on the horizontal semiconductor layer 100 and insulation layers ILD interposed between the electrodes EL1 and EL2.

As discussed above, each of the electrode structures ST may have a stepwise structure on the connection region CNR in order to electrically connect the electrodes EL1 and EL2 to the peripheral logic structure PS. The horizontal semiconductor layer 100 may be provided thereon with a planarized insulation layer 50 covering ends of the electrodes EL1 and EL2 having the stepwise structure.

The first vertical structures VS1 may penetrate the electrode structures ST to come into electrical connection with the horizontal semiconductor layer 100. The second vertical structures VS2 may penetrate the planarized insulation layer 50 and the electrode structures ST to come into contact with the horizontal semiconductor layer 100. As discussed above, each of the first vertical structures VS1 may include a first data storage pattern VP1, a first lower semiconductor pattern LSP1, and a first upper semiconductor pattern USP1. As discussed above, each of the second vertical structures VS2 may include a second data storage pattern VP2, a second lower semiconductor pattern LSP2, and an insulation pillar IP.

The stepwise ends of the electrode structures ST may be provided thereon with a connection line structure that electrically connects the cell array structure CS to the peripheral logic structure PS. The connection line structure may include cell contact plugs CPLG that penetrate the planarized insulation layer 50 and come into connection with the ends of the electrodes EL1 and EL2, connection lines CL that are coupled on the planarized insulation layer 50 to the cell contact plugs CPLG, and connection contact plugs PLG that penetrate the planarized insulation layer 50 and the horizontal semiconductor layer 100 to come into connection with the peripheral circuit lines ICL of the peripheral logic structure PS.

FIGS. 12 to 16 illustrate plan views showing three-dimensional semiconductor memory devices according to aspects of the present disclosure.

Figure 12:
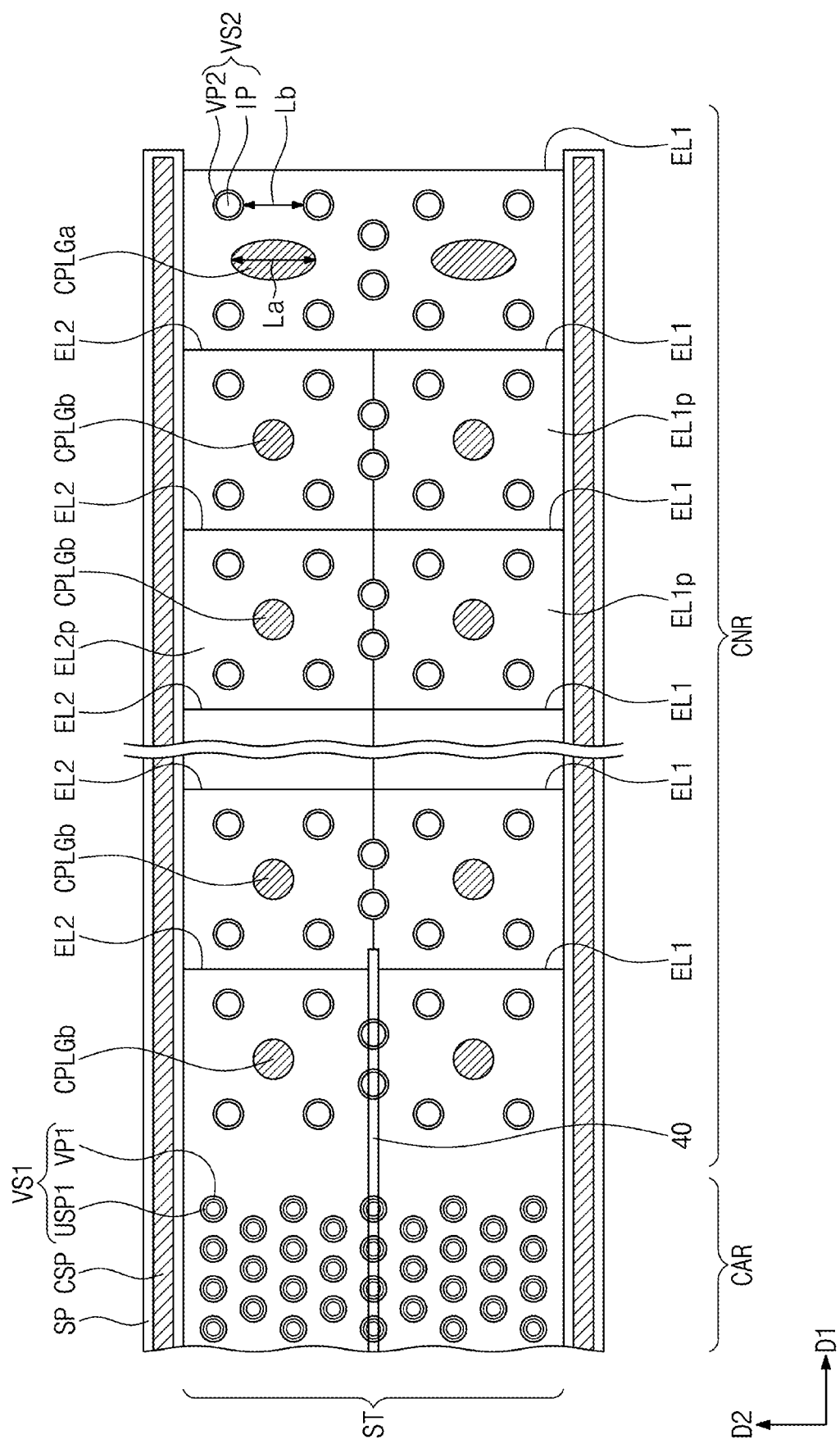
FIGS. 12 to 16 illustrate plan views showing a three-dimensional semiconductor memory device according to aspects of the present disclosure.

In an embodiment illustrated in FIG. 12, cell contact plugs CPLGa and CPLGb may be coupled to the pads EL1$p$ and EL2$p$ of the electrodes EL1 and EL2. The cell contact plugs CPLGa and CPLGb may include outermost cell contact plugs CPLGa coupled to the lowermost first electrode EL1, and each of the outermost cell contact plugs CPLGa may have a width La greater than those of other cell contact plugs CPLGb. For example, when viewed in plan, each of the outermost cell contact plugs CPLGa may have an oval shape. The width La of each of the outermost cell contact plugs CPLGa may be greater than a minimum spacing Lb between the second vertical structures VS2.

Figure 13:
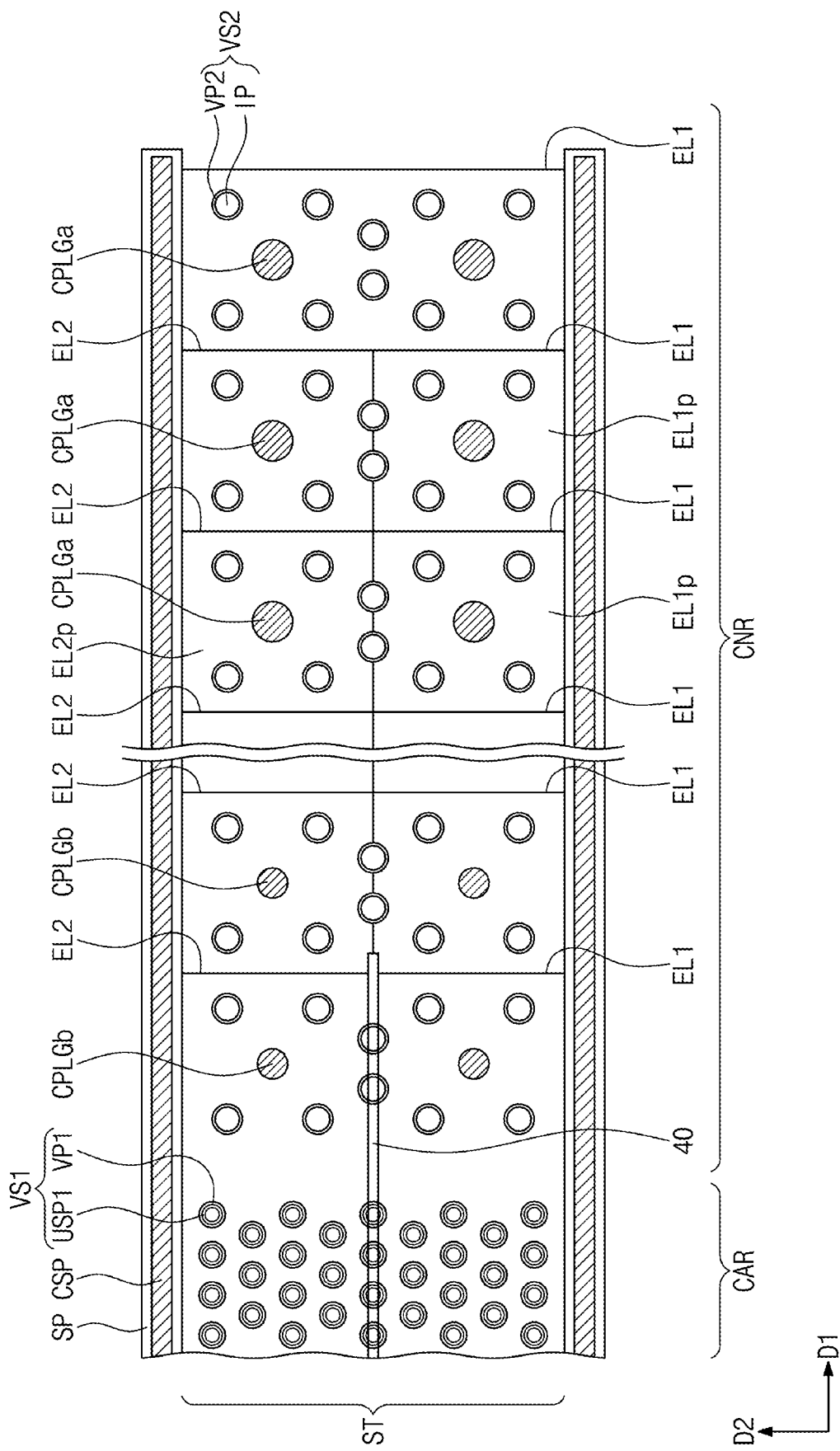

In an embodiment illustrated in FIG. 13, first cell contact plugs CPLGa may be coupled to the electrodes EL1 and EL2 stacked at a lower portion of the electrode structure ST, and second cell contact plugs CPLGb may be coupled to the electrodes EL1 and EL2 stacked at an upper portion of the electrode structure ST. Each of the first cell contact plugs CPLGa may have a width less than those of the second cell contact plugs CPLGb.

As discussed above, when viewed in plan, ones of the second vertical structures VS2 may be disposed around each of the first cell contact plugs CPLGa, and others the second vertical structures VS2 may be disposed around each of the second cell contact plugs CPLGb.

Figure 14:
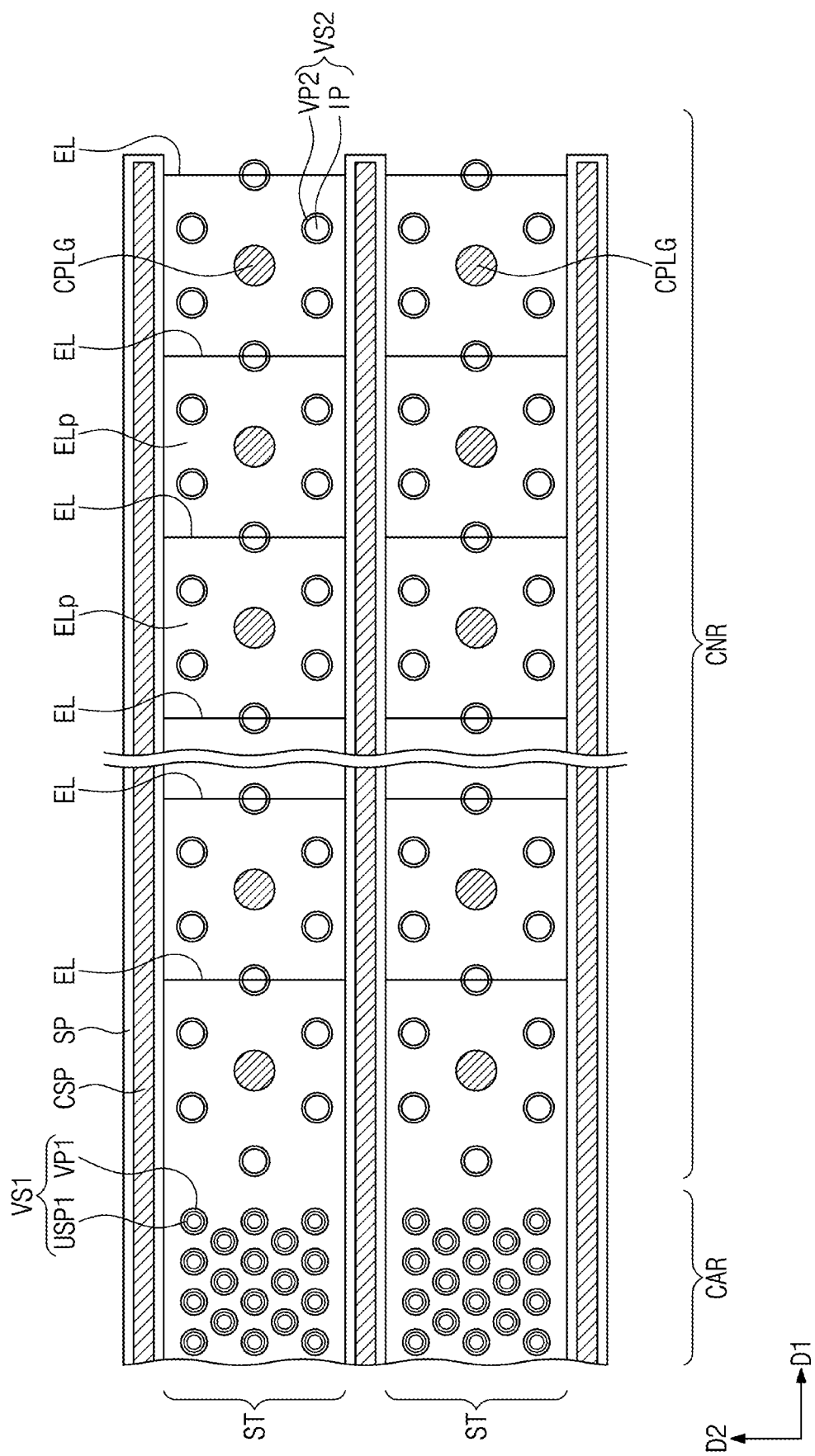
Figure 15:
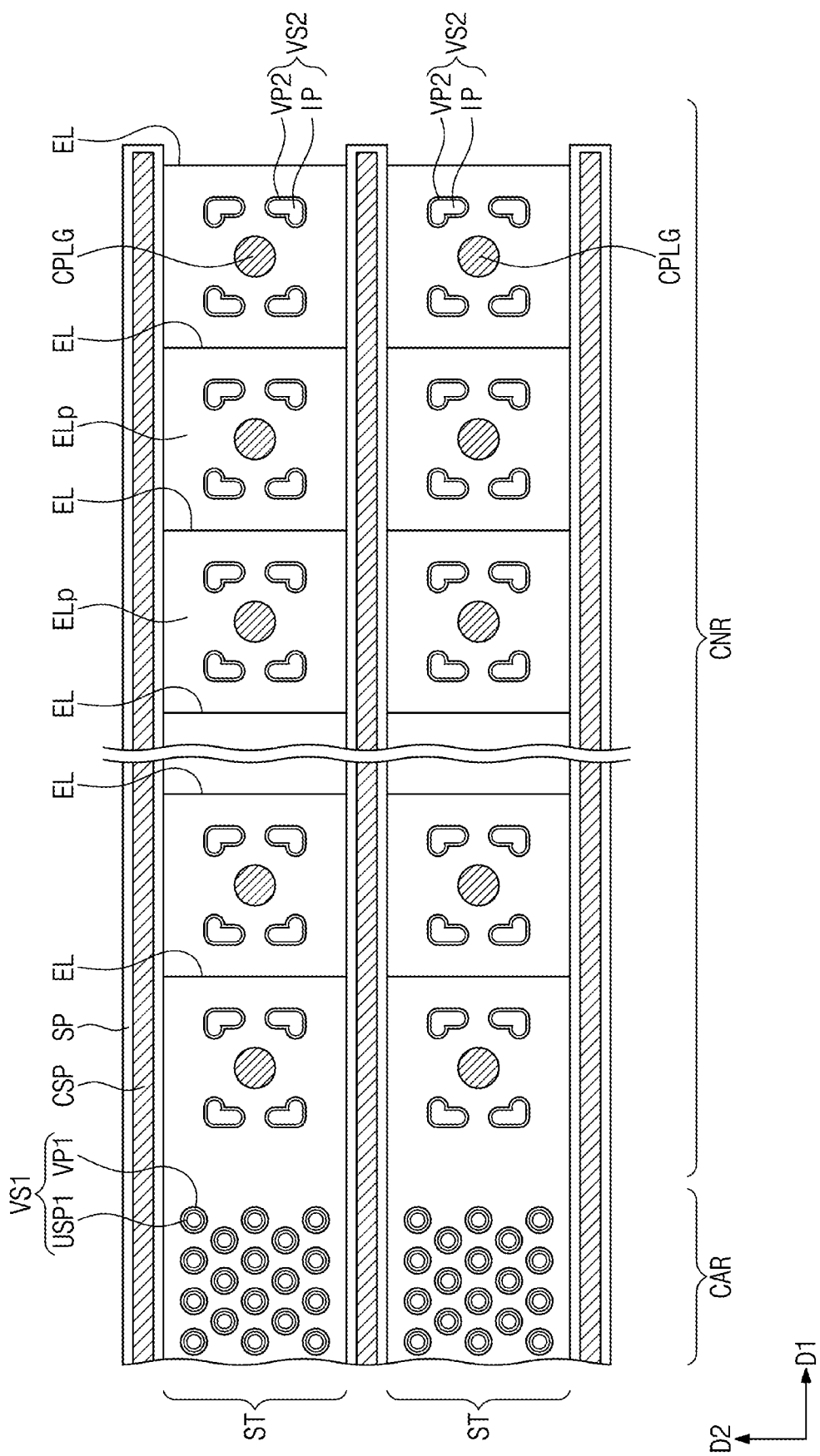
Figure 16:
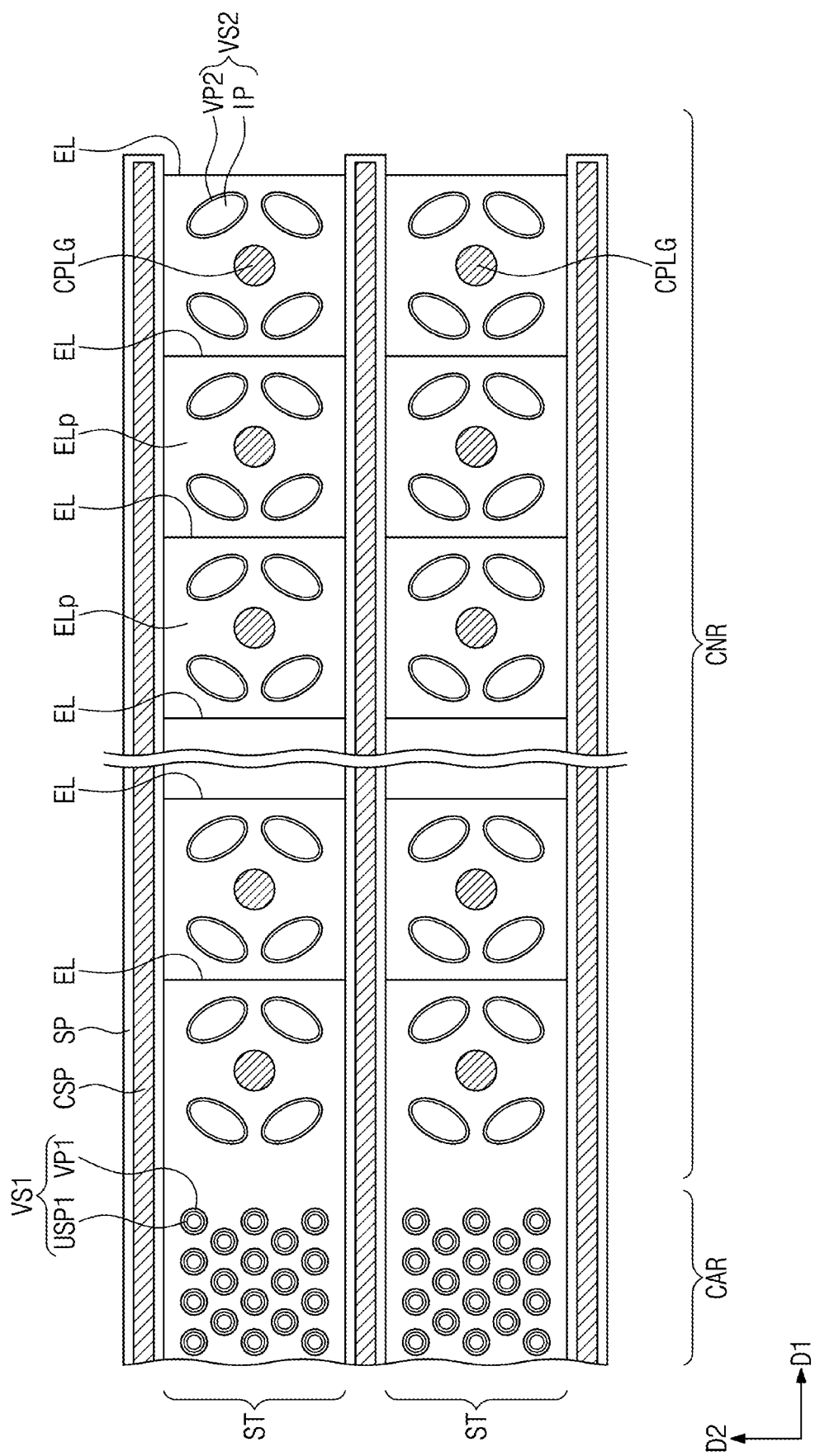

In some embodiments illustrated in FIGS. 14, 15, and 16, the electrode structures ST including the vertically stacked electrodes EL may extend to have linear shapes along the first direction D1. The electrode structures ST may be spaced apart from each other in the second direction D2.

In an embodiment illustrated in FIG. 14, the second vertical structures VS2 may penetrate the electrode structure ST on the connection region CNR, and ones of the second vertical structures VS2 may penetrate the pads ELp of the electrodes EL and others of the second vertical structures VS2 may penetrate boundaries between the pads ELp. The second vertical structures VS2 may be arranged in various ways.

In an embodiment illustrated in FIG. 15, when viewed in plan, each of the second vertical structures VS2 may include protruding portions that extend in the first direction D1 and the second direction D2. The second vertical structures VS2 may be arranged to surround each of the cell contact plugs CPLG. The second vertical structures VS2 adjacent in the first direction D1 or the second direction D2 may be arranged at a minimum distance less than a width of each of the cell contact plugs CPLG.

In an embodiment illustrated in FIG. 16, when viewed in plan, each of the second vertical structures VS2 may have an oval shape whose major axis extends obliquely to the first and second directions D1 and D2. The oval-shaped second vertical structures VS2 may be arranged to surround each of the cell contact plugs CPLG.

FIGS. 17 to 21, 23, and 25 to 28 illustrate cross-sectional views taken along lines I-I', II-II', and III-III' of FIG. 2, showing a method of fabricating a three-dimensional semiconductor memory device according to aspects of the present disclosure. FIGS. 22A and 22B illustrate enlarged views respectively showing sections P1 and P2 of FIG. 21. FIG. 24 illustrates an enlarged view showing section P2 of FIG. 23.

Figure 17:
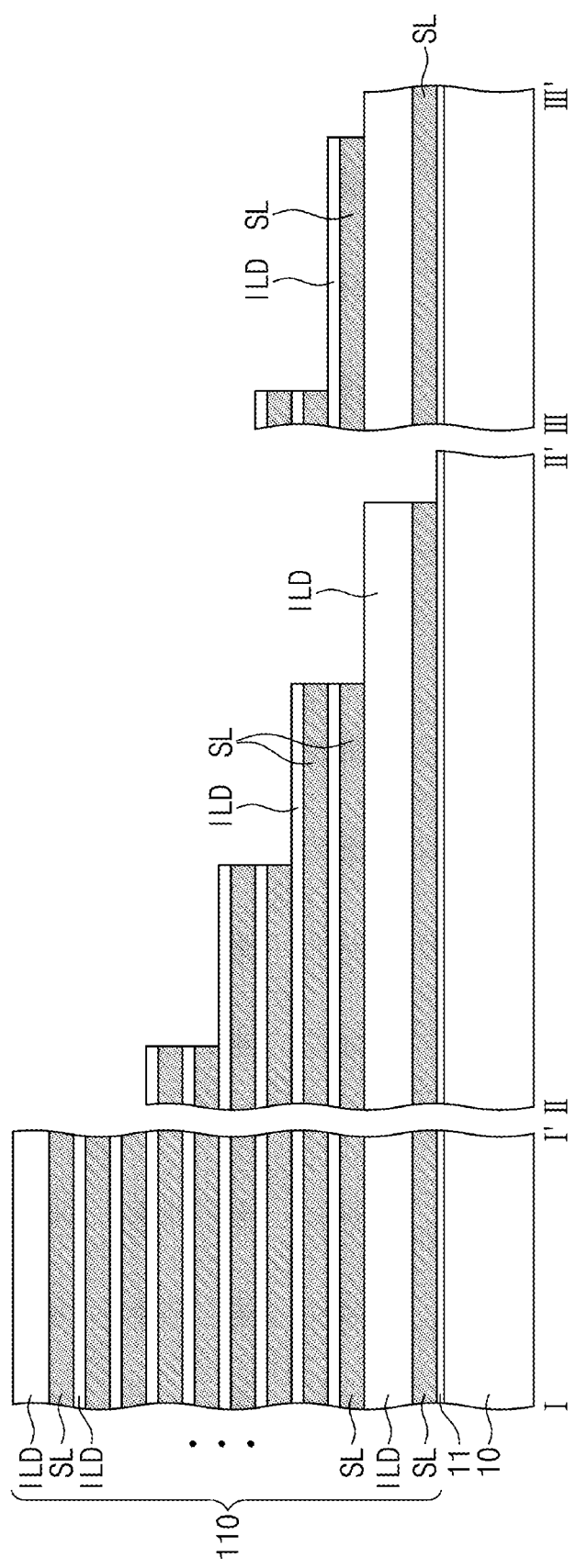
FIGS. 17 to 21, 23, and 25 to 28 illustrate cross-sectional views taken along lines I-I', II-II', and III-III' of FIG. 2, showing a method of fabricating a three-dimensional semiconductor memory device according to aspects of the present disclosure.

Referring to FIGS. 2 and 17, a mold structure 110 may be formed on a substrate 10 including a cell array region CAR and a connection region CNR. The mold structure 110 may include sacrificial layers SL and insulation layers ILD that are vertically and alternately stacked.

When the mold structure 110 is formed, the sacrificial layers SL may be made of a material having an etch selectivity to the insulation layers ILD. The sacrificial layers SL may include an insulating material different from that of the insulation layers ILD. For example, the sacrificial layers SL may be formed of a silicon nitride layer, and the insulation layers ILD may be formed of a silicon oxide layer. The sacrificial layers SL may have substantially the same thickness, and the insulation layers ILD may have different thicknesses depending on their positions.

In some embodiments, the formation of the mold structure 110 may include forming on an entire top surface of the substrate 10 a thin-layer structure in which the sacrificial layers SL and the insulation layers ILD are vertically and alternately stacked and then performing a trimming process on the thin-layer structure. Herein, the trimming process may include forming a mask pattern (not shown) to cover the thin-layer structure on the cell array region CAR and the connection region CNR, etching a portion of the thin-layer structure, and reducing a horizontal area of the mask pattern. When the trimming process is carried out, the etching and reducing steps may be alternately and repeatedly performed. The trimming process may result in allowing the mold structure 110 to have a stepwise structure on the connection region CNR. The stepwise structure may include a first stepwise structure consisting of ends of odd-numbered sacrificial layers SL and a second stepwise structure consisting of ends of even-numbered sacrificial layers SL.

Figure 18:
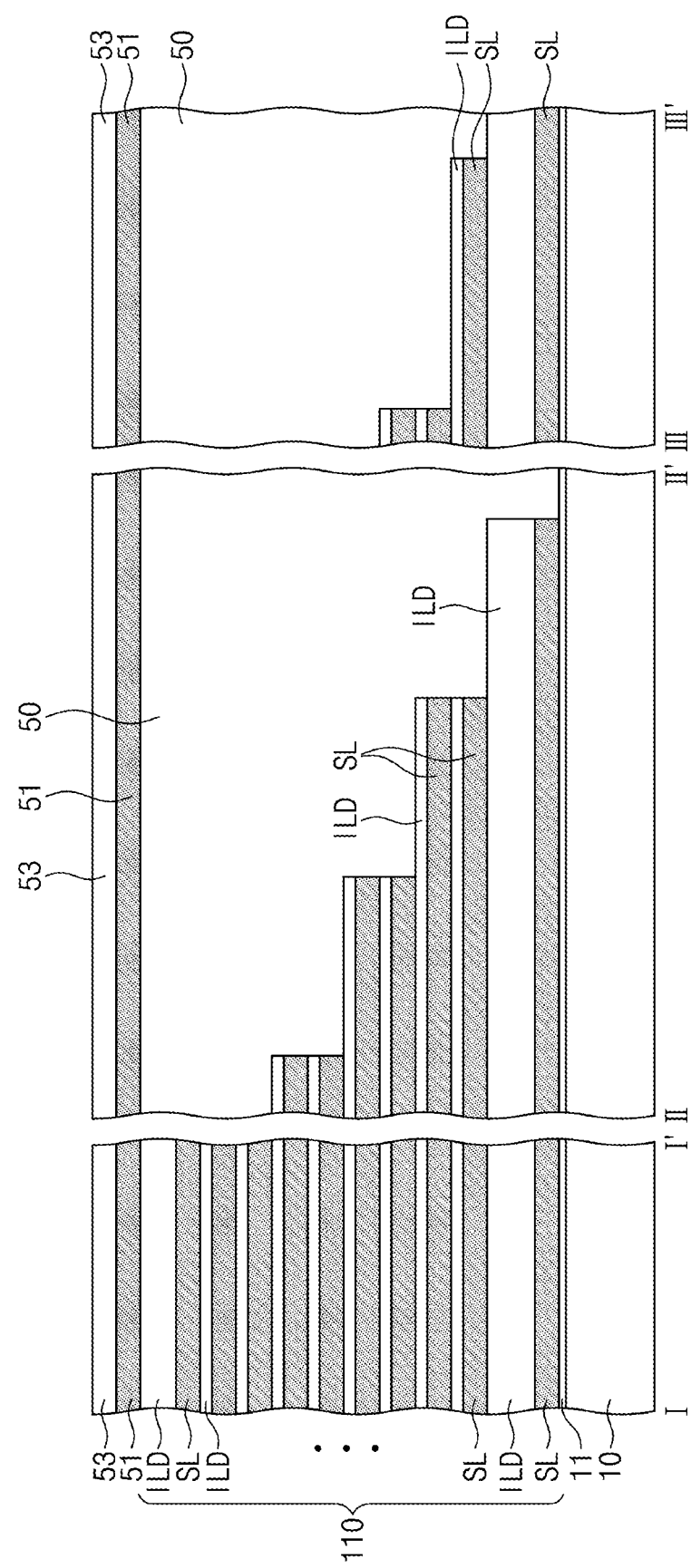

Referring to FIGS. 2 and 18, after the mold structure 110 is formed, a planarized insulation layer 50 may be formed on the entire top surface of the substrate 10. The planarized insulation layer 50 may be formed of an insulating material having an etch selectivity to the sacrificial layers SL. The planarized insulation layer 50 may be formed by forming on the entire top surface of the substrate 10 a buried insulation layer thicker than the mold structure 110 and then performing a planarization process, for example, chemical mechanical polishing (CMP).

After the planarized insulation layer 50 is formed, an etch stop layer 51 and a mask insulation layer 53 may be sequentially formed on the planarized insulation layer 50. The etch stop layer 51 may be formed of a material having an etch selectivity to the planarized insulation layer 50 and the buffer insulation layer 53.

Figure 19:
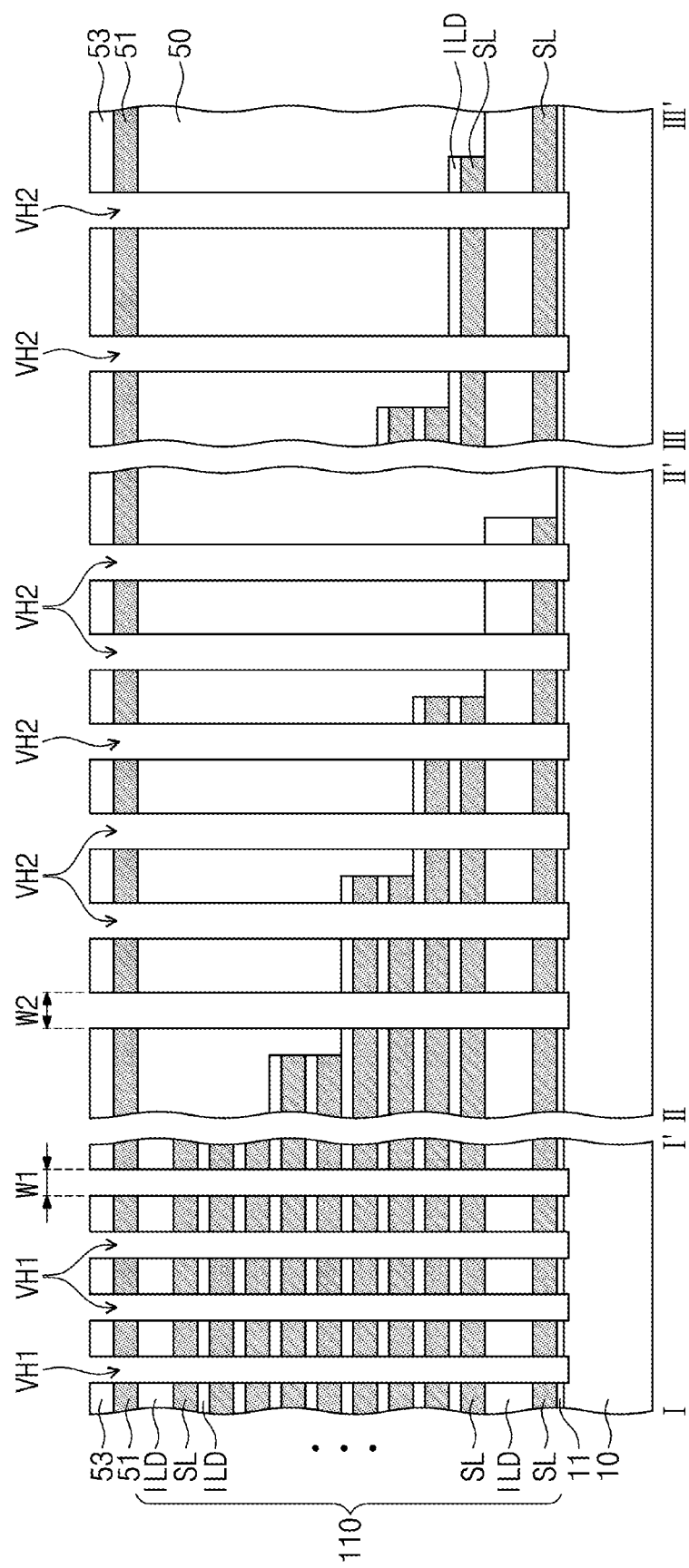

Referring to FIGS. 2 and 19, first vertical holes VH1 may be formed on the cell array region CAR, and second vertical holes VH2 may be formed on the connection region CNR. The first vertical holes VH1 may penetrate the mold structure 110, and the second vertical holes VH2 may penetrate the buffer insulation layer 53, the etch stop layer 51, the planarized insulation layer 50, and the mold structure 110.

The formation of the first and second vertical holes VH1 and VH2 may include forming a mask pattern (not shown) on the buffer insulation layer 53, using the mask pattern (not shown) as an etching mask to anisotropically etch the buffer insulation layer 53, the etch stop layer 51, the planarized insulation layer 50, and the mold structure 110.

When viewed in plan, the first vertical holes VH1 may be arranged in a straight or zigzag fashion. The second vertical holes VH2 may be arranged in a straight fashion when viewed in plan, and may penetrate ends of the sacrificial layers SL on the connection region CNR. Since the second vertical holes VH2 are formed on the connection region CNR, the number of the sacrificial layers SL penetrated by the second vertical holes VH2 may decrease as the second vertical holes VH2 become distant from the cell array region CAR.

Each of the first vertical holes VH1 may have a first upper width W1, and each of the second vertical holes VH2 may have a second upper width W2 greater than the first upper width W1. Each of the first vertical holes VH1 may have a lower width less than the first upper width W1, and each of the second vertical holes VH2 may have a lower width less than the second upper width W2.

When the anisotropic etching process is performed to form the first and second vertical holes VH1 and VH2, the substrate 10 may be over-etched on its top surface and thus the top surface of the substrate 10 exposed to the first and second vertical holes VH1 and VH2 may be recessed to a predetermined depth.

Figure 20:
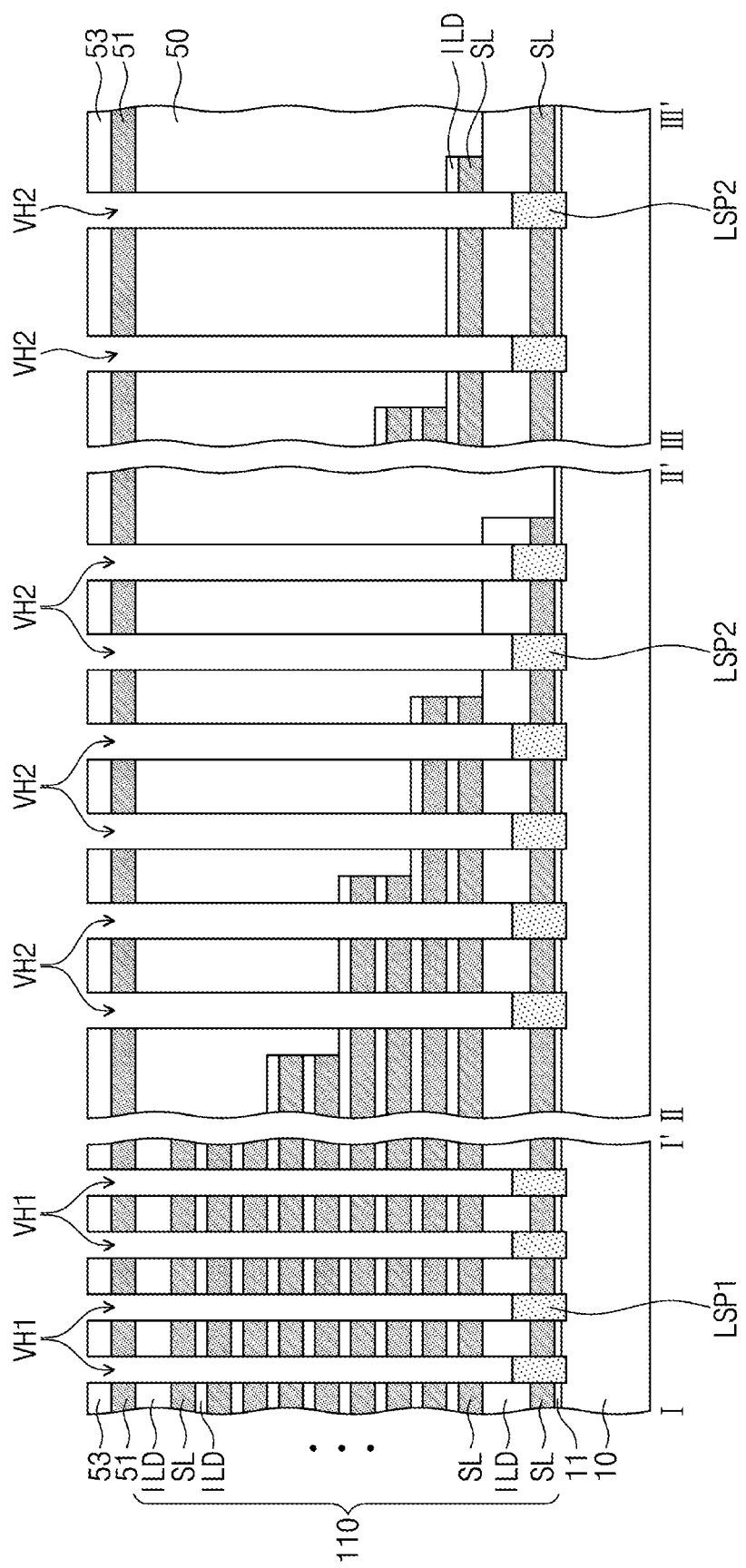

Referring to FIGS. 2 and 20, first and second lower semiconductor patterns LSP1 and LSP2 may be formed to fill lower portions of the first and second vertical holes VH1 and VH2, respectively.

The first and second lower semiconductor patterns LSP1 and LSP2 may be formed by performing a selective epitaxial growth (SEG) process in which the substrate 10 exposed to the first and second vertical holes VH1 and VH2 is used as a seed. Accordingly, the first and second lower semiconductor patterns LSP1 and LSP2 may be formed to have pillar shapes that fill the lower portions of the first and second vertical holes VH1 and VH2.

The first and second lower semiconductor patterns LSP1 and LSP2 may be simultaneously formed of the same semiconductor material. The first and second lower semiconductor patterns LSP1 and LSP2 may be formed of silicon, but the present disclosure is not limited thereto. For example, the first and second lower semiconductor patterns LSP1 and LSP2 may be formed of one of carbon nanostructures, organic semiconductor materials, and compound semiconductors. The first and second lower semiconductor patterns LSP1 and LSP2 may have a single crystalline structure or a polycrystalline structure having a grain size greater than that of a structure formed by chemical vapor deposition.

The first and second lower semiconductor patterns LSP1 and LSP2 may have the same conductivity as that of the substrate 10. The first and second lower semiconductor patterns LSP1 and LSP2 may be in-situ doped with impurities during the selective epitaxial growth process.

In some embodiments, though the first and second lower semiconductor patterns LSP1 and LSP2 are formed at the same time, each of the second lower semiconductor patterns LSP2 may have a height less than those of the first lower semiconductor patterns LSP1. The first lower semiconductor patterns LSP1 may have top surfaces higher than that of a lowermost sacrificial layer SL. The second lower semiconductor patterns LSP2 may have top surfaces higher or lower than that of the lowermost sacrificial layer SL. The height of the second lower semiconductor pattern LSP2 may gradually decrease as the second vertical holes VH2 become distant from the cell array region CAR.

Figure 21:
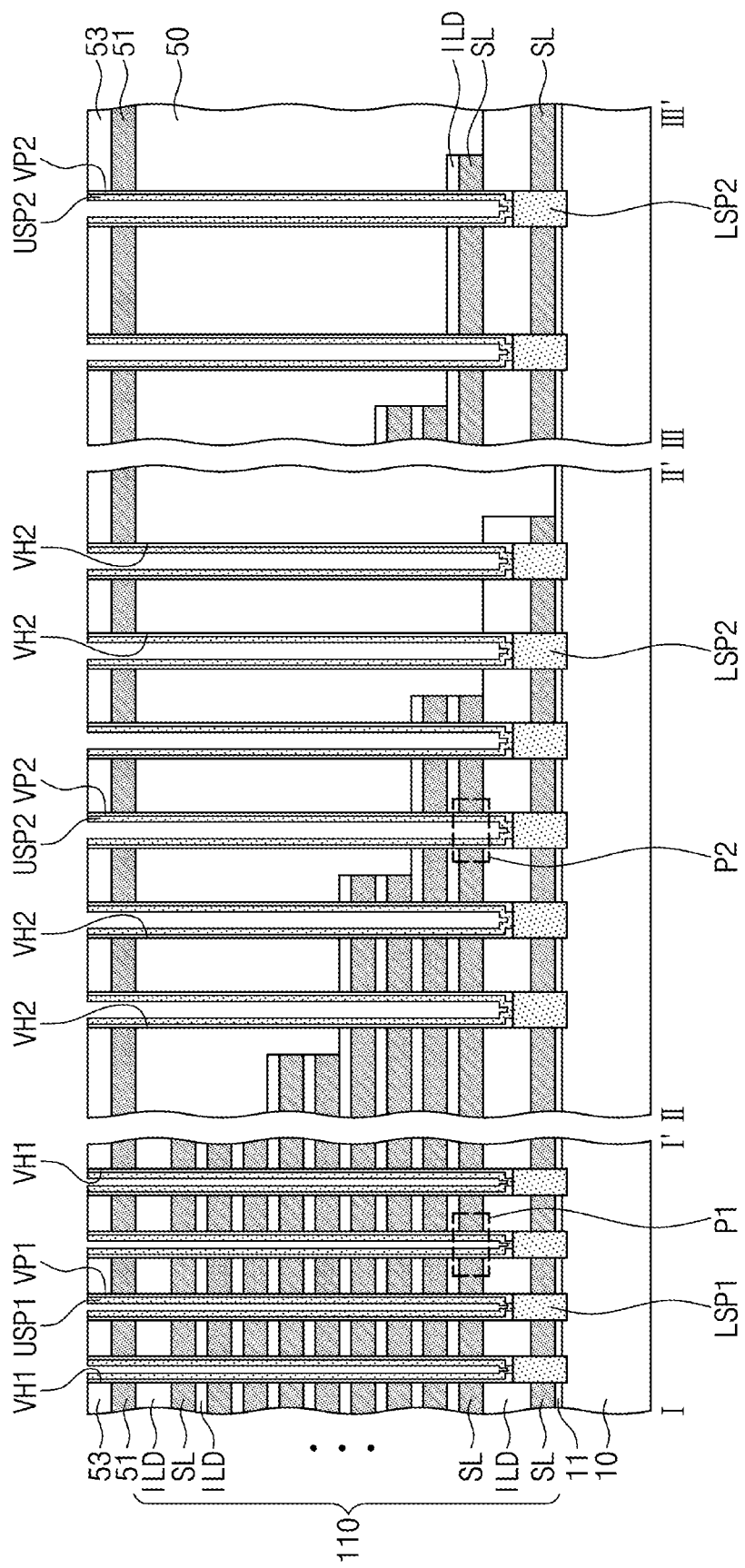
Figure 22A:
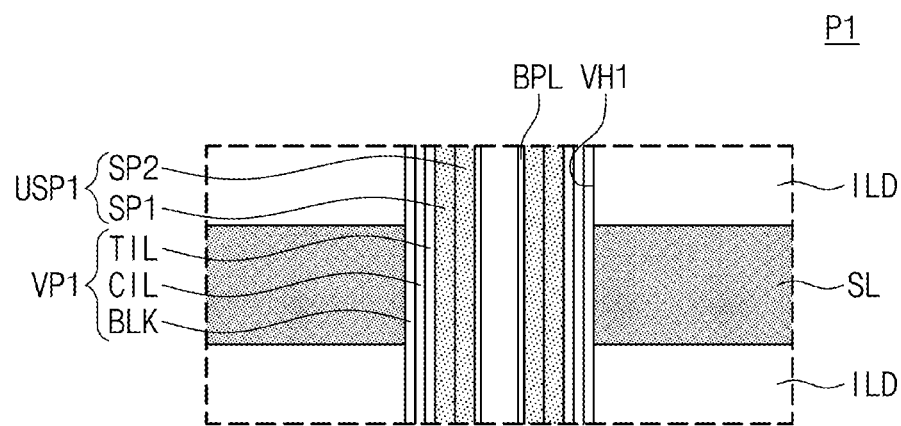
FIGS. 22A and 22B illustrate enlarged views respectively showing sections P1 and P2 of FIG. 21.
Figure 22B:
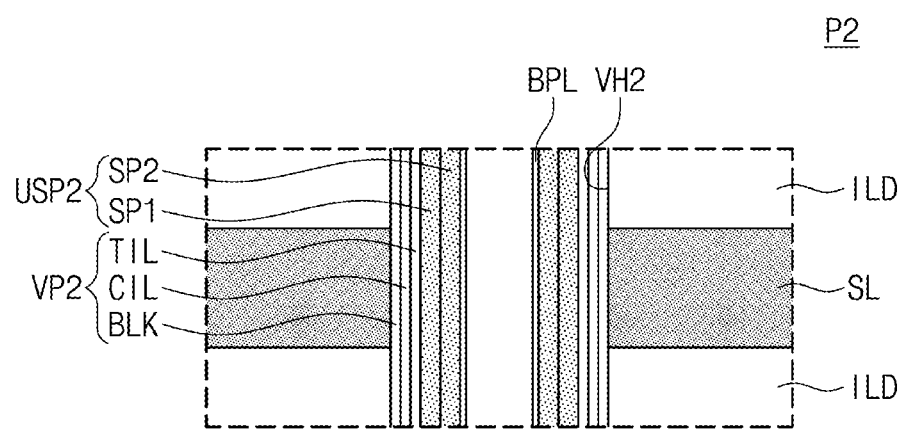

Referring to FIGS. 2 and 21, a first data storage pattern VP1 and a first upper semiconductor pattern USP1 may be formed in the first vertical hole VH1 including the first lower semiconductor pattern LSP1 formed therein. At the same time, a second data storage pattern VP2 and a second upper semiconductor pattern USP2 may be formed in the second vertical hole VH2 including the second lower semiconductor pattern LSP2 formed therein.

Each of the first and second data storage patterns VP1 and VP2 may have a macaroni or pipe shape. The first and second upper semiconductor patterns USP1 and USP2 may be respectively connected to the first and second lower semiconductor patterns LSP1 and LSP2.

For example, referring to FIGS. 22A and 22B, the formation of the first and second data storage patterns VP1 and VP2 and the first and second upper semiconductor patterns USP1 and USP2 may include depositing a data storage layer and a first semiconductor layer each having a uniform thickness on an inner wall of each of the first and second vertical holes VH1 and VH2 respectively including the first and second lower semiconductor patterns LSP1 and LSP2 formed therein, performing an anisotropic etching process on the data storage layer and the first semiconductor layer in order to partially expose the first and second lower semiconductor patterns LSP1 and LSP2, and depositing a second semiconductor layer having a uniform thickness on a surface of the etched first semiconductor layer and surfaces of the exposed first and second lower semiconductor patterns LSP1 and LSP2.

The anisotropic etching process on the data storage layer and the first semiconductor layer may result in forming the first and second data storage patterns VP1 and VP2 and a first semiconductor pattern SP1. The second semiconductor layer may be formed (e.g., conformally formed) to have a thickness that does not completely fill each of the first and second vertical holes VH1 and VH2. As discussed above, each of the first and second upper semiconductor patterns USP1 and USP2 may include a first semiconductor pattern SP1 and a second semiconductor pattern SP2.

The first and second data storage patterns VP1 and VP2 may be formed at the same time, thereby having the same thickness and material. Each of the first and second data storage patterns VP1 and VP2 may be made of a single thin layer or a plurality of thin layers, and may serve as a portion of a data storage layer. For example, the first data storage pattern VP1 may include a blocking insulation layer BLK, a charge storage layer CIL, and a tunnel insulation layer TIL that are sequentially stacked on the inner wall of the first vertical hole VH1. Likewise, the second data storage pattern VP2 may include a blocking insulation layer BLK, a charge storage layer CIL, and a tunnel insulation layer TIL that are sequentially stacked on the inner wall of the second vertical hole VH2.

A buffer oxide layer BPL may further be formed on an inner wall of each of the first and second upper semiconductor patterns USP1 and USP2. An atomic layer deposition (ALD) process may be performed to form the buffer oxide layer BPL having a uniform thickness covering a surface of each of the first and second upper semiconductor patterns USP1 and USP2.

Figure 23:
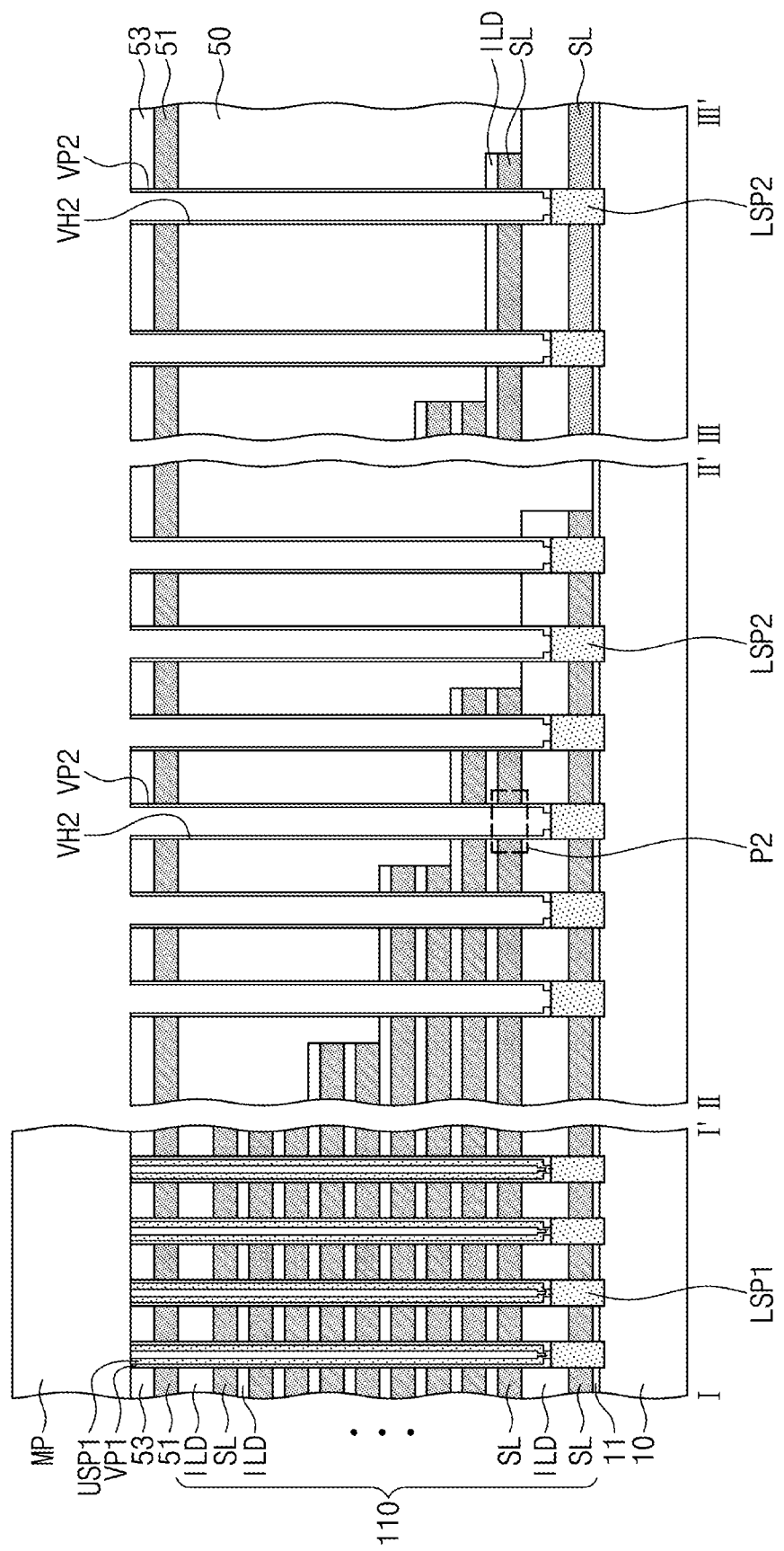
Figure 24:
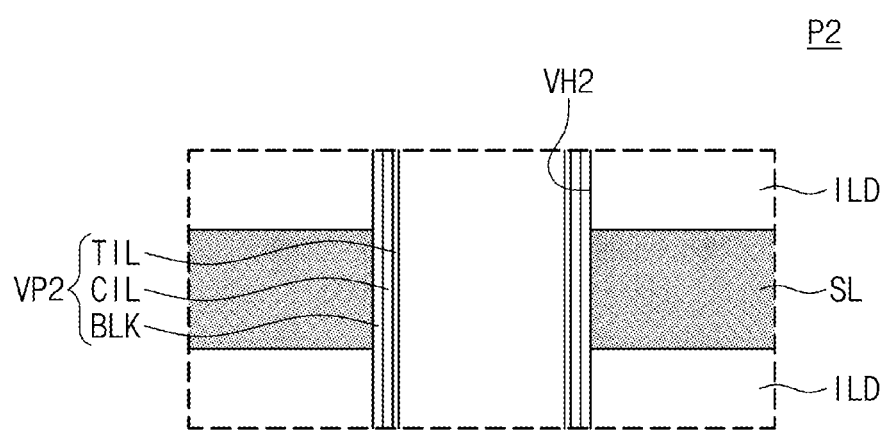
FIG. 24 illustrates an enlarged view showing section P2 of FIG. 23.

Referring to FIGS. 2 and 23, a mask pattern MP may be formed on the mask insulation layer 53 of the cell array region CAR, covering the first data storage pattern VP1 and the first upper semiconductor pattern USP1. The mask pattern MP may expose the inner wall of the second upper semiconductor pattern USP2 on the connection region CNR.

The mask pattern MP may be used as an etching mask to perform an etching process that removes the second upper semiconductor patterns USP2 on the connection region CNR. The removal of the second upper semiconductor patterns USP2 may expose an inner wall of the second data storage pattern VP2 and a portion of the second lower semiconductor pattern LSP2 in the second vertical hole VH2.

The etching process that removes the second upper semiconductor patterns USP2 may be performed using a physical-chemical etching method such as reactive ion etching (RIE), a wet etching method using an etchant, a chemical-thermal decomposition etching method (e.g., gas-phase etching (GPE)), or a combination thereof. For example, the second upper semiconductor patterns USP2 may experience an isotropic etching process or a gas-phase etching process, and the isotropic etching process may use a gas-phase etchant including a standard clean 1 (SC1) solution or a fluorine-based gas (e.g., $Cl_2$).

Referring to FIG. 24, an inner wall of the tunnel insulation layer TIL of the second data storage pattern VP2 may be exposed in the second vertical hole VH2. When the etching process is performed to remove the second upper semiconductor pattern USP2, the tunnel insulation layer TIL of the second data storage pattern VP2 may become reduced in thickness.

Before the second upper semiconductor patterns USP2 are removed, the buffer oxide layer BPL may be isotropically etched if the buffer oxide layer BPL is formed on the surface of the second upper semiconductor pattern USP2. After the second upper semiconductor patterns USP2 are removed from the second vertical holes VH2, the mask pattern MP may be removed.

Figure 25:
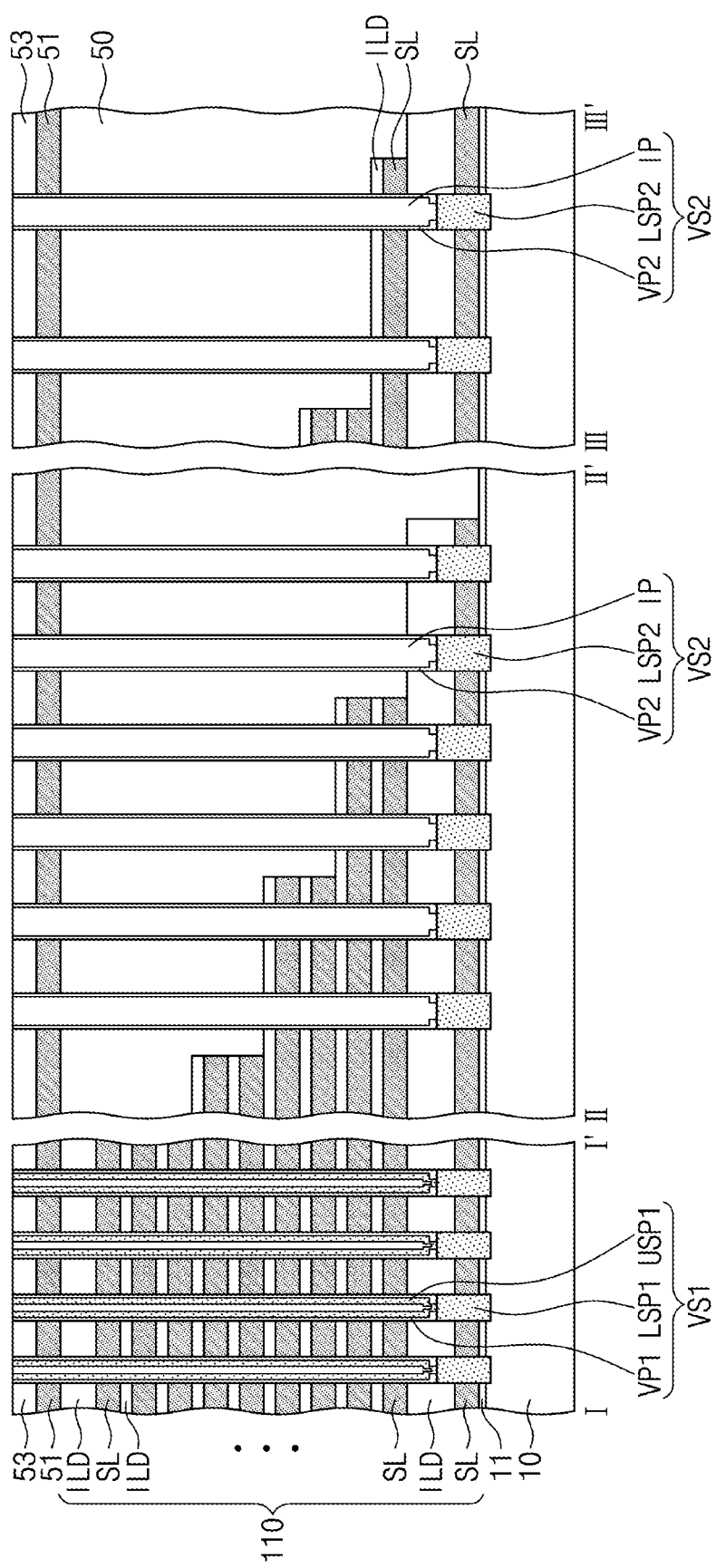

Referring to FIGS. 2 and 25, insulation pillars IP may be formed in the second vertical holes VH2 in which inner walls of the second data storage patterns VP2 are exposed.

The formation of the insulation pillars IP may include forming a gap-fill insulation layer to fill empty spaces defined by the second data storage patterns VP2 and performing a planarization process to expose a top surface of the buffer insulation layer 53. The gap-fill insulation layer may be formed using SOG technology or deposition technology having good, improved, or superior step coverage.

The insulation pillars IP may include, for example, silicon nitride (SiN), silicon oxynitride (SiON), silicon carbide (SiC), silicon carbon nitride (SiCN), or a combination thereof. Alternatively, the insulation pillars IP may include an HDP oxide layer, a TEOS oxide layer, a PE-TEOS oxide layer, a USG layer, a BSG layer, a PSG layer, a BPSG layer, an SOG layer, a TOSZ layer, or a combination thereof.

When the insulation pillars IP are formed, an insulating material or air may fill empty spaces (or gap regions) defined by the first upper semiconductor patterns USP1 in the first vertical holes VH1. Therefore, first vertical structures VS1 may be formed on the cell array region CAR. In addition, second vertical structures VS2 may be formed on the connection region CNR.

Figure 26:
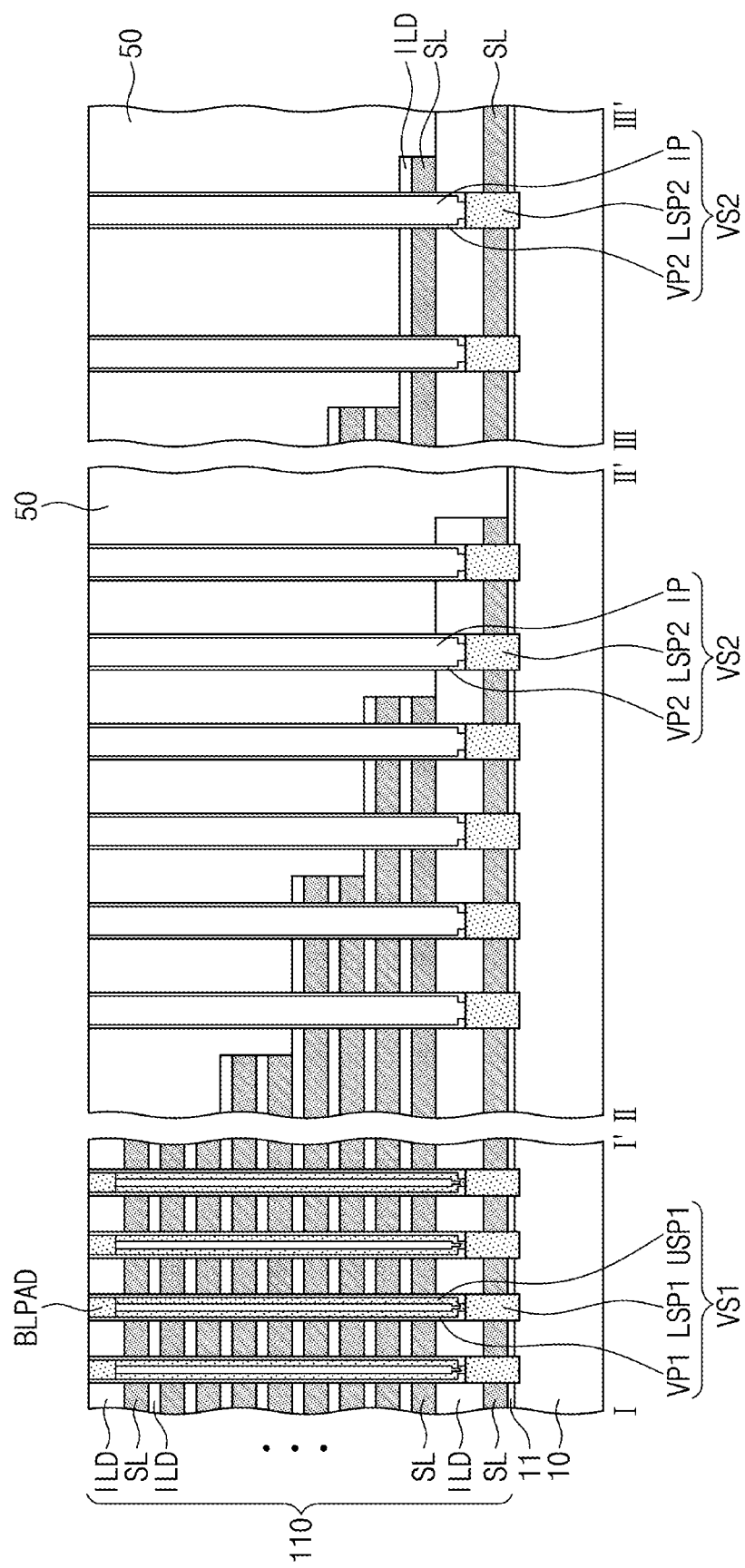

Referring to FIGS. 2 and 26, bit line pads BLPAD may be formed on the first upper semiconductor patterns USP1. The bit line pad BLPAD may be formed by etching upper portions of the first data storage pattern VP1, the first upper semiconductor pattern USP1, and the buried insulation layer to form a recessed region, and then filling the recessed region with a conductive material (e.g., an impurity-doped semiconductor material). Alternatively, the bit line pad BLPAD may be formed by doping impurities into an upper portion of the first upper semiconductor pattern USP1.

When the bit line pad BLPAD is formed on the first upper semiconductor pattern USP1, the second data storage pattern VP2 and the insulation pillar IP may be recessed on their upper portions on the connection region CNR. In this case, as illustrated in FIG. 5E, dummy bit line pad DPAD may be formed on upper portions of the second data storage pattern VP2 and the insulation pillar IP.

The mask insulation layer 53 and the etch stop layer 51 may be removed during or after the formation of the bit line pads BLPAD.

Figure 27:
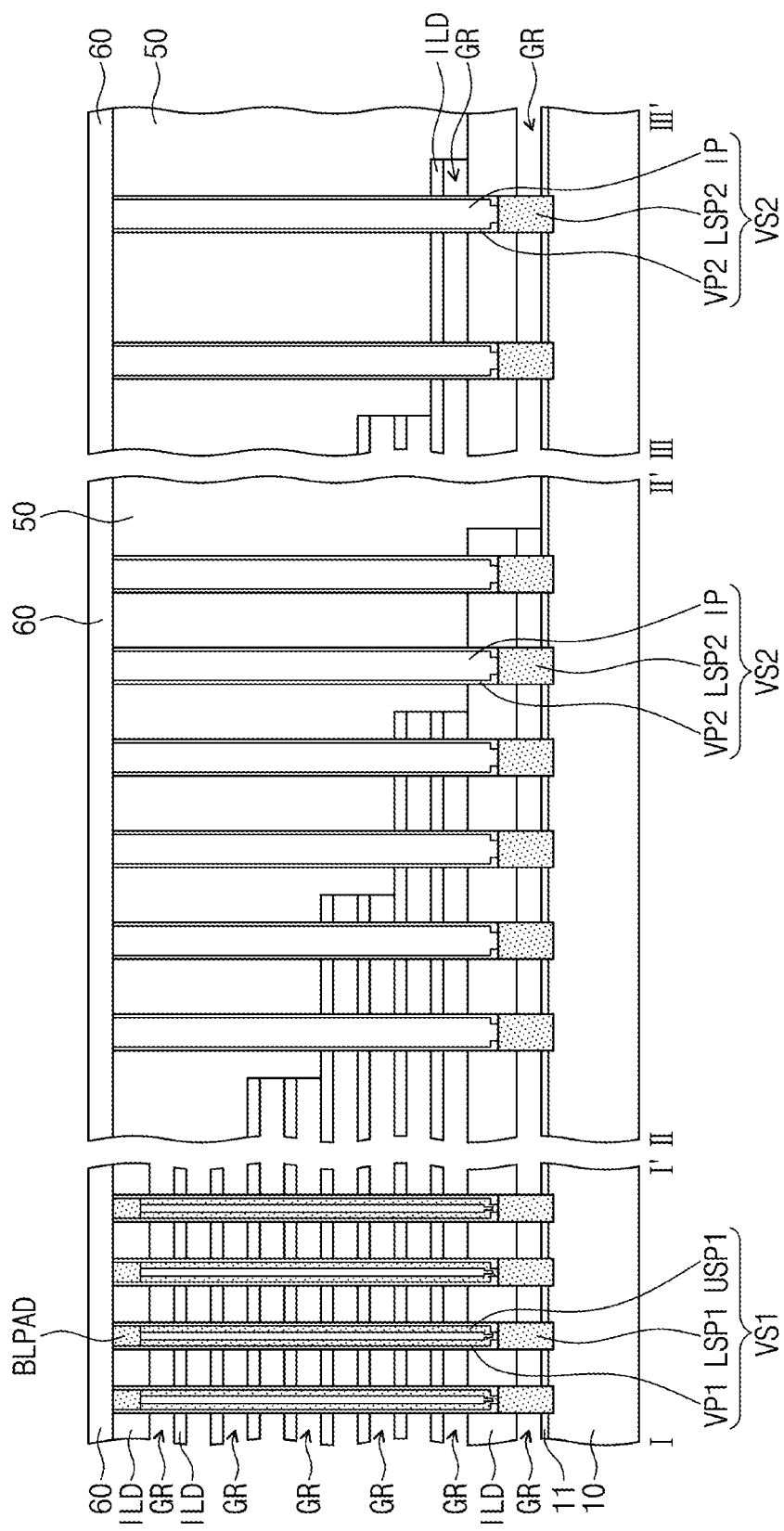
Figure 28:
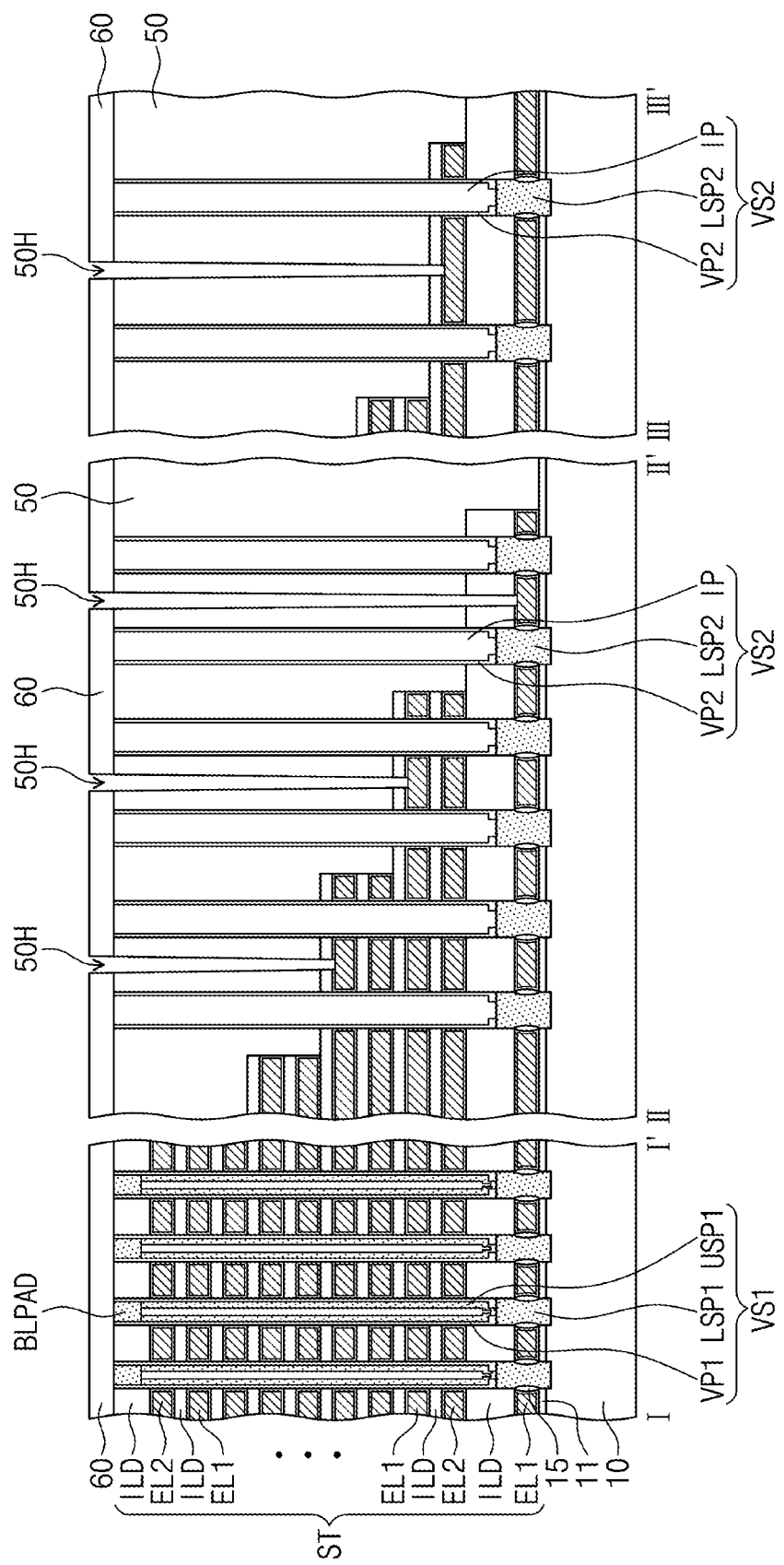

Referring to FIGS. 2, 27, and 28, a first interlayer dielectric layer 60 may be formed on the planarized insulation layer 50, covering top surfaces of the first and second vertical structures VS1 and VS2. The sacrificial layers SL may be replaced by electrodes EL after the first interlayer dielectric layer 60, which may form an electrode structure ST.

For example, referring to FIG. 27, after the first interlayer dielectric layer 60 is formed, the first interlayer dielectric layer 60, the planarized insulation layer 50, and the mold structure 110 may be patterned to form trenches exposing the substrate 10. When viewed in plan, the trenches may have linear shapes extending in a first direction D1. The trenches may be spaced apart from the first and second vertical structures VS1 and VS2, and may expose sidewalls of the sacrificial layers SL. After the trenches are formed, common source regions (see CSR of FIG. 4) may be formed in the substrate 10 exposed to the trenches.

The sacrificial layers SL exposed to the trenches may be removed to form gate regions GR. The gate regions GR may be formed by isotropically etching the sacrificial layers SL using a recipe that exhibits an etch selectivity to the buffer insulation layer 11, the insulation layers ILD, the first and second vertical structures VS1 and VS2, and the substrate 10. The isotropic etching process may completely remove the sacrificial layers SL. For example, when the sacrificial layers SL are silicon nitride layers, and when the insulation layers ILD and the buffer insulation layer 11 are silicon oxide layers, the isotropic etching process may be performed using an etchant including phosphoric acid.

The gate regions GR may horizontally extend between the insulation layers ILD from the trench, and may partially expose sidewalls of the first and second vertical structures VS1 and VS2. In this sense, the gate regions GR may be defined by the insulation layers ILD vertically adjacent to each other and sidewalls of the first and second data storage patterns VP1 and VP2. A lowermost one of the gate regions GR may partially expose sidewalls of the first and second lower semiconductor patterns LSP1 and LSP2.

Referring to FIGS. 2 and 28, a gate dielectric layer 15 may be formed on the sidewall of the first lower semiconductor pattern LSP1 exposed to the lowermost gate region GR. The gate dielectric layer 15 may be formed by heat treatment under a gas ambient including oxygen atoms. Thus, the sidewall of the first lower semiconductor pattern LSP1 exposed to the gate region GR may be thermally oxidized to form the gate dielectric layer 15.

Horizontal insulation patterns HP and electrodes EL may be formed in the gate regions GR. For example, the horizontal insulation patterns HP and the electrodes EL may be formed by sequentially depositing a horizontal insulation layer, a barrier metal layer (e.g., TiN, TaN, or WN), and a metal layer (e.g., W) on the mold structure 110 including the gate regions GR formed therein, and then anisotropically etching the horizontal insulation layer, the barrier metal layer, and the metal layer that are deposited on an inner wall of the trench. The horizontal insulation pattern HP may include a silicon oxide layer or a high-k dielectric layer, serving as a portion of a data storage layer of an NAND Flash memory device.

As the electrodes EL replace the sacrificial layers SL of the mold structure 110, as discussed with reference to FIGS. 2, 3, and 4, an electrode structure ST may be formed to include the electrodes EL and the insulation layers ILD that are vertically and alternately stacked.

After the electrode structure ST is formed, as discussed with reference to FIGS. 3 and 4, a common source region (CSR of FIG. 4), an insulation spacer (SP of FIG. 4), and a common source plug (CSP of FIG. 4) may be formed, and a second interlayer dielectric layer 70 may be formed on the first interlayer dielectric layer 60.

The first and second interlayer dielectric layers 60 and 70 and the planarized insulation layer 50 may be patterned to form cell contact holes 50H on the connection region CNR. The cell contact holes 50H may be formed by forming an etching mask pattern (not shown) on the second interlayer dielectric layer 70, and then anisotropically etching the first and second interlayer dielectric layers 60 and 70 and the planarized insulation layer 50. The cell contact holes 50H may be formed between a plurality of the second vertical structures VS2. In some embodiments, since upper portions of the second vertical structures VS2 are formed of an insulating material, it may be possible to increase a process margin for forming the cell contact holes 50H. In some embodiments, when the cell contact holes 50H are formed, due to a misalignment of the etching mask pattern and/or an increase in widths of the cell contact holes 50H, the second vertical structures VS2 may be partially exposed to the cell contact holes 50H.

The cell contact holes 50H may be filled with a conductive material to form cell contact plugs CPLG coupled to the electrodes EL. Bit line contact plugs, subsidiary bit lines, bit lines, and connection lines discussed above may be formed.

According to some embodiments of the inventive concepts provided herein, unlike the first vertical structures provided on the cell array region that include a semiconductor material, the upper portions of the second vertical structures on the connection region may include an insulating material. Accordingly, even though the cell contact plugs coupled to the electrodes are adjacent to or in contact with the second vertical structures, no current may flow through the second vertical structures when a three-dimensional semiconductor memory device is operated.

Furthermore, even when a distance is reduced between the cell contact plug and its adjacent second vertical structure, a process margin of the cell contact plugs may be obtained, or may be securely obtained, regardless of the positions of the second vertical structures.

Although the inventive concepts provided herein have been described in connection with example embodiments illustrated in the accompanying drawings, it will be understood to those skilled in the art that various changes and modifications may be made without departing from the scope of the inventive concepts provided herein. It will be apparent to those skilled in the art that various substitution, modifications, and changes may be thereto without departing from the scope and spirit of the inventive concepts provided herein.

What is claimed is:

1. A three-dimensional semiconductor memory device, comprising:
   a substrate including a first region and a second region;
   an electrode structure including electrodes vertically stacked on the substrate;
   a plurality of first vertical structures extending into the electrode structure on the first region; and
   a plurality of second vertical structures extending into the electrode structure on the second region,
   wherein each of the first vertical structures comprises:
      a vertical semiconductor pattern extending into the electrode structure; and
      a first data storage pattern between the vertical semiconductor pattern and the electrode structure,
   wherein each of the second vertical structures comprises:
      an insulation structure extending into the electrode structure; and
      a second data storage pattern between the insulation structure and the electrode structure,
   wherein each first vertical structure comprises a first width, and each second vertical structure comprises a second width greater than the first width,
   wherein bottom surfaces of the insulation structures are lower than bottom surfaces of the vertical semiconductor patterns and bottom surfaces of the second data storage patterns,
   wherein the first data storage pattern of one of the first vertical structures comprises a first thickness on a sidewall of the vertical semiconductor pattern of the one of the first vertical structures,
   wherein the second data storage pattern of one of the second vertical structures comprises a second thickness on the sidewall of the insulation structure of the one of the second vertical structures, and
   wherein the second thickness is substantially equal to or less than the first thickness.

2. The device of claim 1, wherein each of the first and second vertical structures comprises a tunnel insulation layer, a charge storage layer, and a blocking insulation layer that are sequentially stacked.

3. The device of claim 1, wherein a thickness of one of the vertical semiconductor patterns is less than half a width of one of the insulation structures.

4. The device of claim 1, wherein at least one of the insulation structures directly contacts the substrate.

5. A three-dimensional semiconductor memory device, comprising:
  a semiconductor layer including a first region and a second region;
  a plurality of first vertical structures on the first region and extending in a first direction perpendicular to a top surface of the semiconductor layer; and
  a plurality of second vertical structures on the second region and extending in the first direction,
  wherein each of the first vertical structures comprises:
    a vertical semiconductor pattern extending in the first direction and contacting the semiconductor layer; and
    a first data storage pattern surrounding a periphery of the vertical semiconductor pattern, and
  wherein each of the second vertical structures comprises:
    an insulation structure extending in the first direction and contacting the semiconductor layer;
    a second data storage pattern surrounding a periphery of the insulation structure; and
    a protruding portion extending in the first direction and in a second direction perpendicular to the first direction.

6. The device of claim 5, further comprising an electrode structure including electrodes vertically stacked on the semiconductor layer, wherein the electrode structure comprises a stepwise structure on the second region, wherein each of the electrodes comprises a pad that constitutes the stepwise structure on the second region, and wherein the second vertical structures extend into the pad of each of the electrodes.

7. The device of claim 6, further comprising cell contact plugs coupled to the pads of the electrodes on the second region, wherein each of the cell contact plugs is between adjacent second vertical structures.

8. The device of claim 7, wherein each of the cell contact plugs is partially surrounded by the second vertical structures, in a plan view.

9. A three-dimensional semiconductor memory device, comprising:
  a substrate including a first region and a second region;
  an electrode structure including electrodes vertically stacked on the substrate;
  a plurality of first vertical structures extending into the electrode structure on the first region; and
  a plurality of second vertical structures extending into the electrode structure on the second region,
  wherein each of the first vertical structures comprises:
    a vertical semiconductor pattern extending into the electrode structure;
    a first data storage pattern between the vertical semiconductor pattern and the electrode structure; and
    a first lower pattern in contact with the vertical semiconductor pattern, the first data storage pattern, and the substrate,
  wherein each of the second vertical structures comprises:
    an insulation structure extending into the electrode structure;
    a second data storage pattern between the insulation structure and the electrode structure; and
    a second lower pattern in contact with the insulating structure, the second data storage pattern, and the substrate, and
  wherein each first lower pattern comprises a first width, and each second lower pattern comprises a second width greater than the first width.

10. The device of claim 9, wherein the first data storage pattern of one of the first vertical structures comprises a first thickness on a sidewall of the vertical semiconductor pattern of the one of the first vertical structures,
  wherein the second data storage pattern of one of the second vertical structures comprises a second thickness on the sidewall of the insulation structure of the one of the second vertical structures, and
  wherein the second thickness is substantially equal to or less than the first thickness.

11. The device of claim 9, wherein each of the first and second vertical structures comprises a tunnel insulation layer, a charge storage layer, and a blocking insulation layer that are sequentially stacked.

12. The device of claim 9, wherein the first lower pattern and the second lower pattern are epitaxial patterns.

13. The device of claim 12, wherein the first lower pattern has a first height and the second lower pattern has a second height that is less than the first height.

14. The device of claim 9, further comprising an interlayer dielectric layer in contact with an upper surface of the insulation structures of the second vertical structures.

15. The device of claim 9, wherein each first vertical structure comprises a bit line pad that is surrounded by the first data storage pattern.

16. The device of claim 15, wherein each bit line pad is coupled to a bit line contact plug.

17. The device of claim 15, wherein an upper surface of each bit line pad is substantially coplanar with upper surfaces of each insulation structure of the second vertical structures.

18. The device of claim 9, further comprising a buffer insulation layer interposed between the substrate and the electrode structure.

19. The device of claim 9, wherein the electrode structure has a stepwise structure on the second region.

20. The device of claim 19, wherein each of the electrodes comprises a pad that constitutes the stepwise structure on the second region.

* * * * *